(12) United States Patent
Clark et al.

(10) Patent No.: US 12,261,209 B2
(45) Date of Patent: Mar. 25, 2025

(54) REPLACEMENT CHANNEL 2D MATERIAL INTEGRATION

(71) Applicant: Tokyo Electron Limited, Tokyo (JP)

(72) Inventors: Robert D. Clark, Albany, NY (US); H. Jim Fulford, Albany, NY (US); Mark I. Gardner, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 422 days.

(21) Appl. No.: 17/666,265

(22) Filed: Feb. 7, 2022

(65) Prior Publication Data

US 2023/0253467 A1 Aug. 10, 2023

(51) Int. Cl.
- *H01L 29/417* (2006.01)
- *H01L 21/8234* (2006.01)
- *H01L 29/10* (2006.01)
- *H01L 29/78* (2006.01)

(52) U.S. Cl.
CPC ............ *H01L 29/41791* (2013.01); *H01L 21/823412* (2013.01); *H01L 21/823418* (2013.01); *H01L 29/1033* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 9,024,376 B2 | 5/2015 | Masuoka et al. | |
| 9,425,324 B2 | 8/2016 | Diaz et al. | |
| 9,478,624 B2 | 10/2016 | Colinge et al. | |
| 11,437,482 B2* | 9/2022 | Liang | H01L 29/1606 |
| 11,832,458 B2* | 11/2023 | Lau | H10K 19/10 |
| 2005/0191812 A1* | 9/2005 | Pritchard | H01L 29/66606 257/E29.159 |
| 2015/0137075 A1* | 5/2015 | Heo | H01L 29/66045 257/29 |
| 2015/0270349 A1* | 9/2015 | Cheng | H01L 29/785 438/154 |
| 2018/0151751 A1* | 5/2018 | Yeh | H01L 29/1606 |
| 2020/0006541 A1* | 1/2020 | Lin | H01L 29/66969 |
| 2020/0388680 A1* | 12/2020 | Lee | H01L 29/0669 |
| 2021/0305378 A1* | 9/2021 | Seol | H01L 29/1606 |
| 2021/0408297 A1* | 12/2021 | Kula | H01L 29/78696 |
| 2023/0335587 A1* | 10/2023 | Tung | H01L 29/778 |
| 2023/0335589 A1* | 10/2023 | Xu | H01L 29/6656 |

FOREIGN PATENT DOCUMENTS

| | | | | | |
|---|---|---|---|---|---|
| CN | 108831928 B | * | 7/2020 | ............ | H01L 29/24 |
| CN | 113161412 A | * | 7/2021 | ............ | B82Y 30/00 |
| CN | 113206091 A | * | 8/2021 | ..... | H01L 21/823807 |

\* cited by examiner

*Primary Examiner* — Scott B Geyer
(74) *Attorney, Agent, or Firm* — Foley & Lardner LLP

(57) ABSTRACT

Methods for the manufacture of semiconductor devices with integrated two-dimensional (2D) materials are disclosed. Aspects can include forming a base structure comprising a seed material with a chemical element; forming source/drain contacts coupled to first and second portions of the base structure, respectively, wherein the source/drain contacts each have at least the chemical element; exposing a third portion of the base structure; selectively growing a 2D material at least coupled to the third portion of the base structure; and forming an active gate coupled to the 2D material.

20 Claims, 43 Drawing Sheets

Perpendicular to Gate 500

Looking along Gate (cut through Channel) 502

Top View 504

Looking along Gate (cut through Channel) 1502

Top View 1504

Perpendicular to Gate 1500

Side View 3500

Cross-section View 3502

REPLACEMENT CHANNEL 2D MATERIAL INTEGRATION

TECHNICAL FIELD

The present invention relates generally to the field of manufacturing semiconductor devices.

BACKGROUND

In the manufacture of semiconductor devices (especially on the microscopic scale), various fabrication processes are executed, such as film-forming depositions, etch mask creation, patterning, material etching and removal, and doping treatments. These processes are performed repeatedly to form desired semiconductor device elements on a substrate. Conventional microfabrication techniques only manufacture transistors in one plane, while wiring or metallization is formed above the active device plane. Such devices are accordingly characterized as two-dimensional (2D) circuits, manufactured using 2D fabrication techniques. Although scaling efforts have greatly increased the number of transistors per unit area in 2D circuits, these 2D fabrication techniques are approaching physical limitations at single digit nanometer semiconductor device fabrication nodes. Semiconductor device fabricators have expressed a desire for semiconductor circuits in which transistors have increased complexity and dimensionality.

SUMMARY

A variety of semiconductor devices that integrate 2D materials into a 3D transistor structure are proposed, which aim to overcome scaling limitations experienced in planar devices by increasing transistor density in volume rather than area. Such 2D materials have the potential for high mobility at scaled body thicknesses, and therefore enable sub-nanometer channel thickness regions. Such techniques can enable future nanoscale transistors, which may be implemented in a variety of logical circuits, including central processing units (CPUs), graphics processing units (GPUs), and field-programmable gate arrays (FPGAs).

In one embodiment, a method that may include forming a base structure comprising a seed material with a chemical element. The method can include forming source/drain contacts coupled to first and second portions of the base structure, respectively, wherein the source/drain contacts each have at least one chemical element in common with the 2D material. The method can include exposing a third portion of the base structure. The method can include selectively growing a two-dimensional (2D) material at least coupled to the third portion of the base structure. The method can include forming an active gate coupled to the 2D material.

The source/drain contacts may be formed adjacent to a dummy gate structure, and exposing the third portion of the base structure comprises etching the dummy gate structure. Forming the source/drain contacts may include forming a dielectric material isolating the source/drain contacts from the dummy gate structure. Selectively growing the 2D material may include selectively growing the 2D material on the source/drain contacts.

Forming the active gate may include forming a high-k dielectric material on the 2D material; and forming a gate metal on the high-k dielectric material, such that the gate metal is isolated from the source/drain contacts. The source/drain contacts may be formed after the 2D material. The source/drain contacts straddle a portion of the 2D material. The 2D material may be formed to be coupled to both the first and second portions of the base structure.

In another embodiment, a device may include a base structure comprising a seed material with a chemical element. The device includes source/drain contacts coupled to first and second portions of the base structure, respectively, wherein the source/drain contacts each have at least the chemical element. The device includes a two-dimensional (2D) material at least coupled to a third portion of the base structure. The device includes an active gate coupled to the 2D material.

The source/drain contacts are separated from the active gate by a dielectric material. The 2D material may be coupled to a portion of the source/drain contacts. The active gate may comprise a high-k dielectric material formed on the 2D material; and a gate metal formed on the high-k dielectric material, such that the gate metal is isolated from the source/drain contacts. The device may be a fin field-effect transistor (FinFET) device, and a fin structure of the FinFET device comprises the seed material and the 2D material. The source/drain contacts may straddle a portion of the 2D material. The device may comprise a cap layer formed on the source/drain contacts.

In yet another embodiment, a transistor structure may include a source metal, a drain metal, and a channel of a 2D material coupled to the source metal and the drain metal, the 2D material formed on a seed material. The transistor structure may include a high-k dielectric coupled to a portion of the 2D material. The transistor structure may include a gate metal disposed on the high k-dielectric.

The source metal and the drain metal may each comprise a chemical element, and the 2D material may comprise the chemical element. The channel and the seed material may form a fin structure of a FinFET device. The source metal and the drain metal may straddle the fin structure. The seed material and the 2D material may extend between the source metal and the drain metal, and the seed material may be separated from the source metal and the drain metal by the 2D material. The source metal and the drain metal may be coupled to the seed material, and the 2D material may be formed on the seed material in a region between the source metal and the drain metal.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect of the invention can be combined with other aspects. Aspects can be implemented in any convenient form. As used in the specification and in the claims, the singular form of 'a', 'an', and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
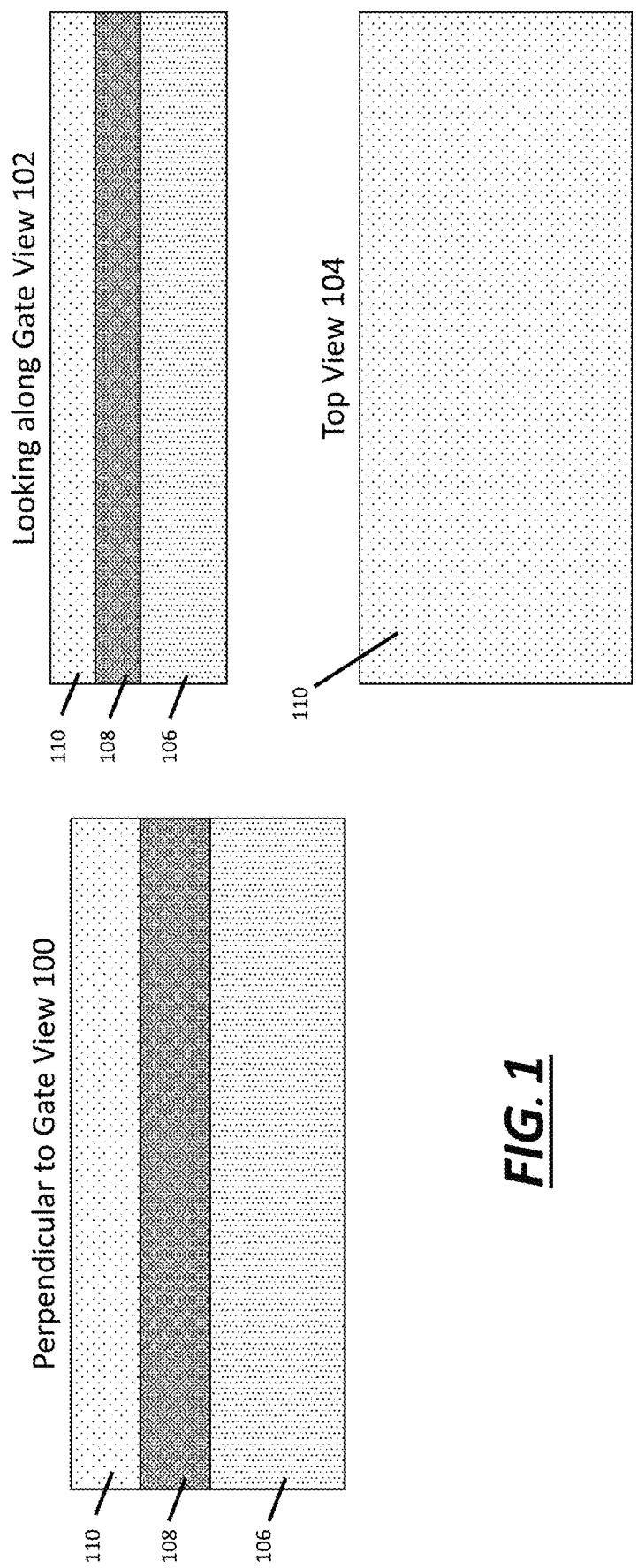
FIGS. 1-10 show various views of a first process flow to integrate 2D materials into a planar semiconductor device, according to an embodiment.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

The embodiments described herein may enable integration of 2D materials semiconductors with a variety of semiconductor devices, including planar 2D devices, 2D FinFETs, as well as nanosheet devices. The techniques described herein provide 2D materials with the potential for very high mobility, and thus enable sub-nanometer channel thickness regions to enable future nanoscale transistors. The present techniques can be implemented using seed materials, which may be implanted, doped, or compositionally controlled in order to inductively dope channel materials or source/drain materials in semiconductor devices. In addition, the present techniques can use layer transfer to create a single crystalline seed layer (which can help guide 2D material growth), allowing for device creation at any layer in the integrated circuit. Therefore, the present techniques can be used to create multi-layer logic circuits, thereby allowing for higher circuit density. The present techniques can be used to create any type of semiconductive device, including NMOS devices, PMOS devices, and CFET devices. The techniques described herein may be implemented utilizing pre-aligned masks to improve etching various layers or openings during device fabrication.

Reference will now be made to the figures, which for the convenience of visualizing the fabrication techniques described herein, illustrate a variety of materials undergoing a process flow in various views. Unless expressly indicated otherwise, each Figure represents one (or a set) of fabrication steps in a process flow for manufacturing the devices described herein. In the various views of the Figures, connections between conductive layers or materials may or may not be shown. However, it should be understood that connections between various layers, masks, or materials may be implemented in any configuration to create electric or electronic circuits. When such connections are shown, it should be understood that such connections are merely illustrative, and are intended to show a capability for providing such connections, and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, the techniques described herein may be implemented in any shape or geometry for any material or layer to achieve desired results. In addition, examples in which two transistors or devices are shown stacked on top of one another are shown for illustrative purposes only, and for the purposes of simplicity. Indeed, the techniques described herein may provide for one to any number of stacked devices. Further, although the devices fabricated using these techniques are shown as transistors, it should be understood that any type of electric electronic device may be manufactured using such techniques, including but not limited to transistors, variable resistors, resistors, and capacitors.

FIGS. 1-11 show various views of a first process flow to integrate 2D materials into a planar semiconductor device. Each of the FIGS. 1-11 generally refer to one or more process steps in a process flow, each of which are described in detail in connection with a respective Figure. For the purposes of simplicity and ease of visualization, some reference numbers may be omitted from some Figures. Referring to FIG. 1, illustrated is a first cross-sectional view 100 that shows a stack of layers perpendicular to where a gate will be formed, a second cross-sectional view 102 that shows the stack of layers along where the gate will be formed, and a plan view 104 that depicts the top of the stack of layers. At the start of the process flow, a first layer of dielectric material 106 (shown in the legend as the "Dielectric Material 106") is formed as a base material, and a layer of seed material 108 is formed on top of the layer of dielectric material 106.

The dielectric material 106 can be any type of material that can bond with, or otherwise be coupled to, a layer of the seed material 108. The dielectric material 106 can have a relatively high dielectric constant and behave as an insulator. The seed material 108 can be a single crystal semiconductor material (e.g., Si, SiGe, Ge, any III-V or II-VI material, etc.), or any type of insulator material (e.g., oxides, other insulators, etc.). The seed material 108 can be bonded to or transferred onto the first layer of the dielectric material 106. Some further examples of the seed material 108 include hexagonal boron nitride, diamond, or epitaxial dielectric like LaAlO$_x$ or STO, among others. The dielectric 106 may be any type of dielectric material that is capable of being disposed, patterned, or otherwise provided as a base layer. Some examples of dielectric materials can include, but are not limited to, oxide materials. A layer of a first sacrificial material 110 (shown as the "Sacrificial Overlayer (SO)") is formed on top of the seed material 108. The sacrificial material 110 can be any type of material that is capable of being removed in further process steps, and may include metals, metal oxides, semiconductor materials, or dielectric materials. The layer of the first sacrificial material 110 can be grown, deposited (e.g., using processes such as atomic layer deposition (ALD), chemical vapor deposition (CVD), physical vapor deposition (PVD), or plasma-enhanced CVD (PECVD), etc.), or otherwise formed on the layer of seed material 108. The layer of the first sacrificial material 110 can be, for example, about 2 nm to about 4 nm thick.

Figure 2:
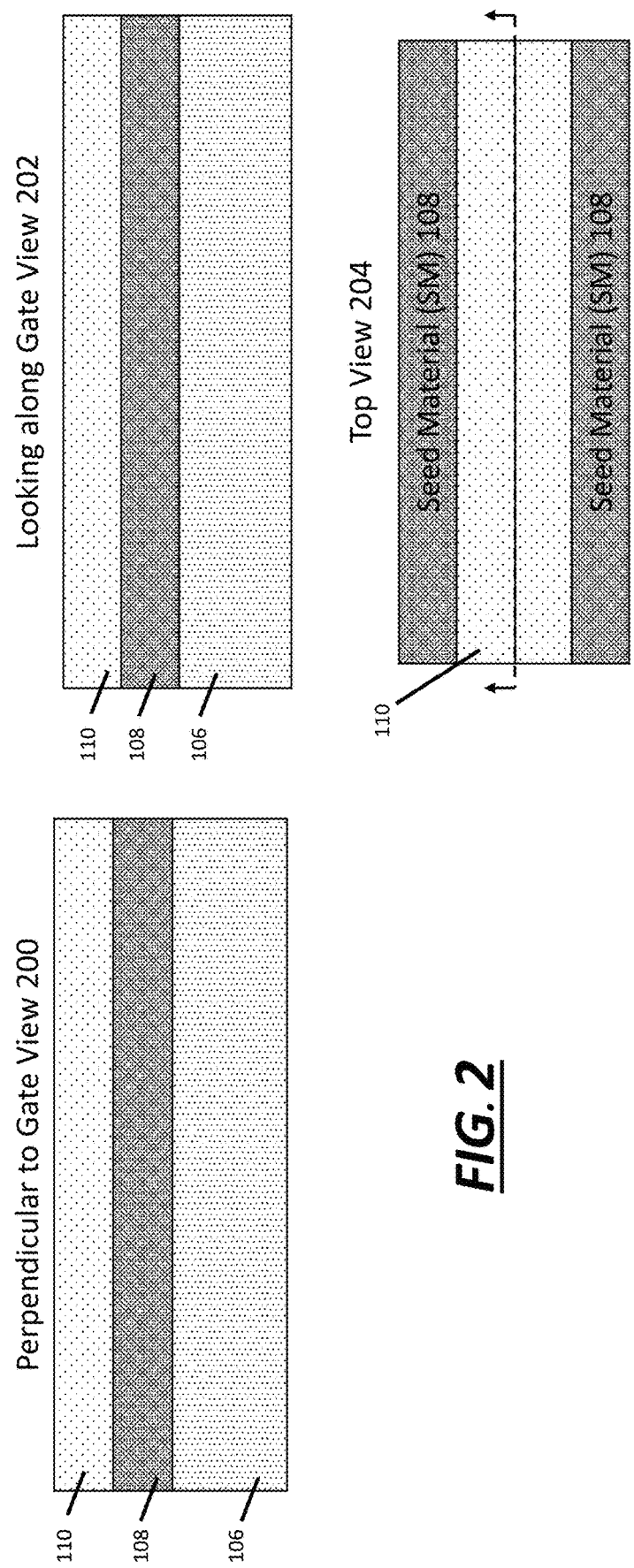

Referring to FIG. 2, illustrated are cross-sectional views 200 and 202 and the top view 204 of the next stage in the process flow. As shown, the layer of the sacrificial material 110 can be etched or otherwise removed to expose a portion of the seed material 108. The resulting width of the sacrificial material 110 can define the width of the channel of the transistors that will be fabricated using this process flow. In some implementations, further etching can be performed to pattern the sacrificial material 110 to define a segmented channel field effect transistor (FET). In some implementations, the seed material 108 can also be partially etched or otherwise removed in the same manner as the sacrificial material 110, thereby exposing the dielectric layer 106 rather than the seed material 108. Any suitable etching or material removal technique can be used, including but not limited to dry etching, wet etching, or plasma etching techniques, among others.

Figure 3:
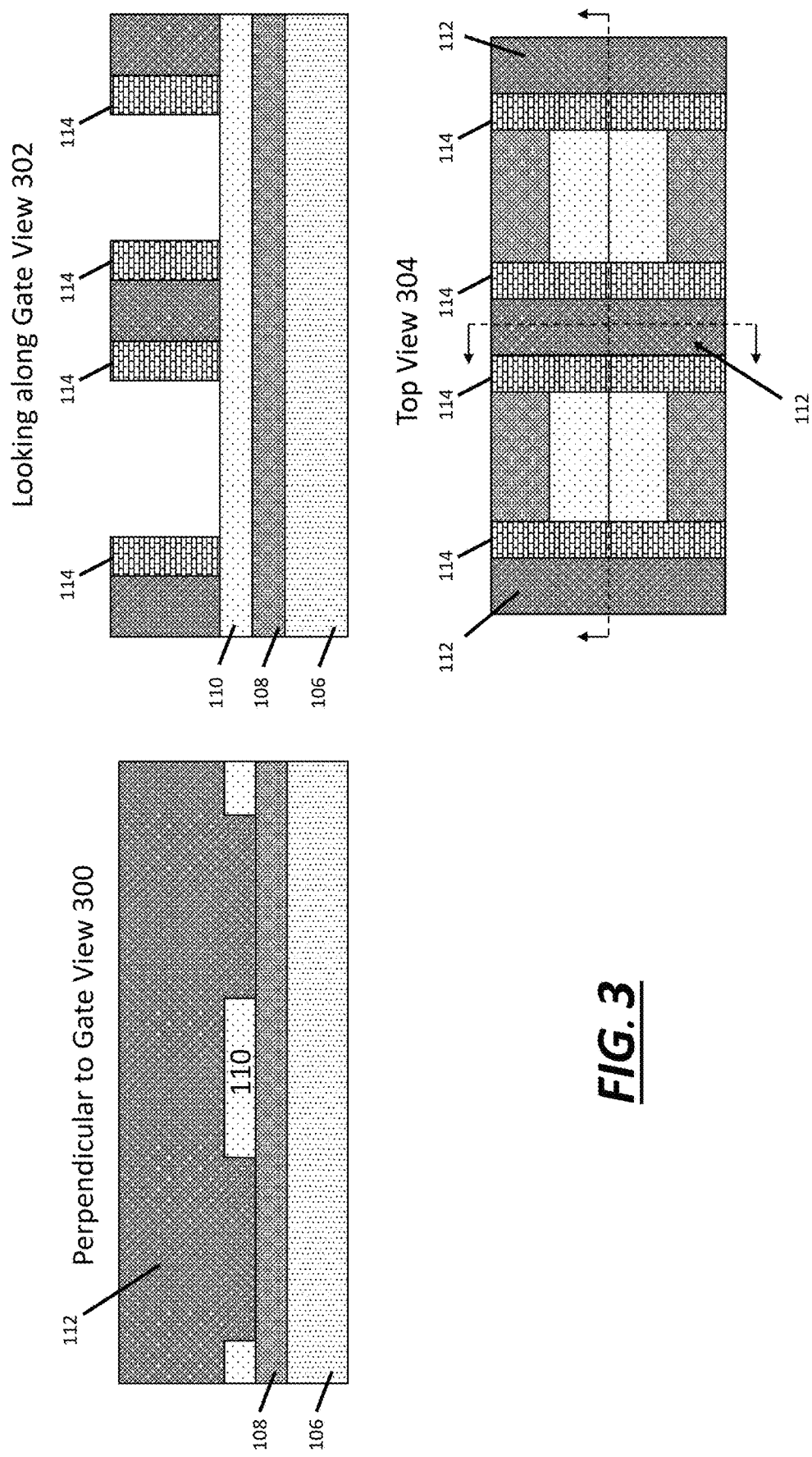

Referring to FIG. 3, illustrated are cross-sectional views 300 and 302 and the top view 304 of the next stage in the process flow. At this stage, a sacrificial material 112 (or other similar, suitable material) can be deposited to form a "dummy gate," or a region of material that occupies a volume that will layer be replaced with "an active gate," "replacement gate," or "metal gate" (e.g., including high-k dielectric material(s) and metal material(s)). For example, the sacrificial material 112 can straddle (e.g., at least partially cover or overlap) the sacrificial material 110. Note that the cross sectional view 300 shows multiple strips of the sacrificial material 110, indicating that the steps in the process flow can be performed to define several transistors in multiple directions along the sheet of the seed material 108. The sacrificial material 112 can first be deposited using any suitable material deposition technique, including ALD, CVD, PVD, or PECVD, among others. The sacrificial material 112 can be patterned using a suitable mask to define one or more openings that expose portions of the sacrificial material 110 and the seed material 108. In some implementations, a layer of the sacrificial material 112 can be formed, and then etched to form the openings. In some implementations, multiple types of material may be used in place of the sacrificial material 112 to leverage AB selectively to form different types of gates (e.g., for N-type or P-type transistors). For example, a region that will have a first type of gate may be formed with the sacrificial material 112, while a region that will have a different type of gate may be filled with a different type of material.

A second dielectric material 114 can then be formed in the openings and can contact a portion of the both the sacrificial material 110 and the seed material 108, as shown in the cross-sectional view 302 and the top view 304. The second dielectric material 114 can be formed using any suitable material deposition technique, including ALD, CVD, PVD, or PECVD, among others. In some implementations, the second dielectric material 114 can be deposited to fill the openings defined between the sacrificial material 112 and subsequently etched using a suitable etching technique to expose the sacrificial material 110 and the seed material 108, as shown.

Figure 4:
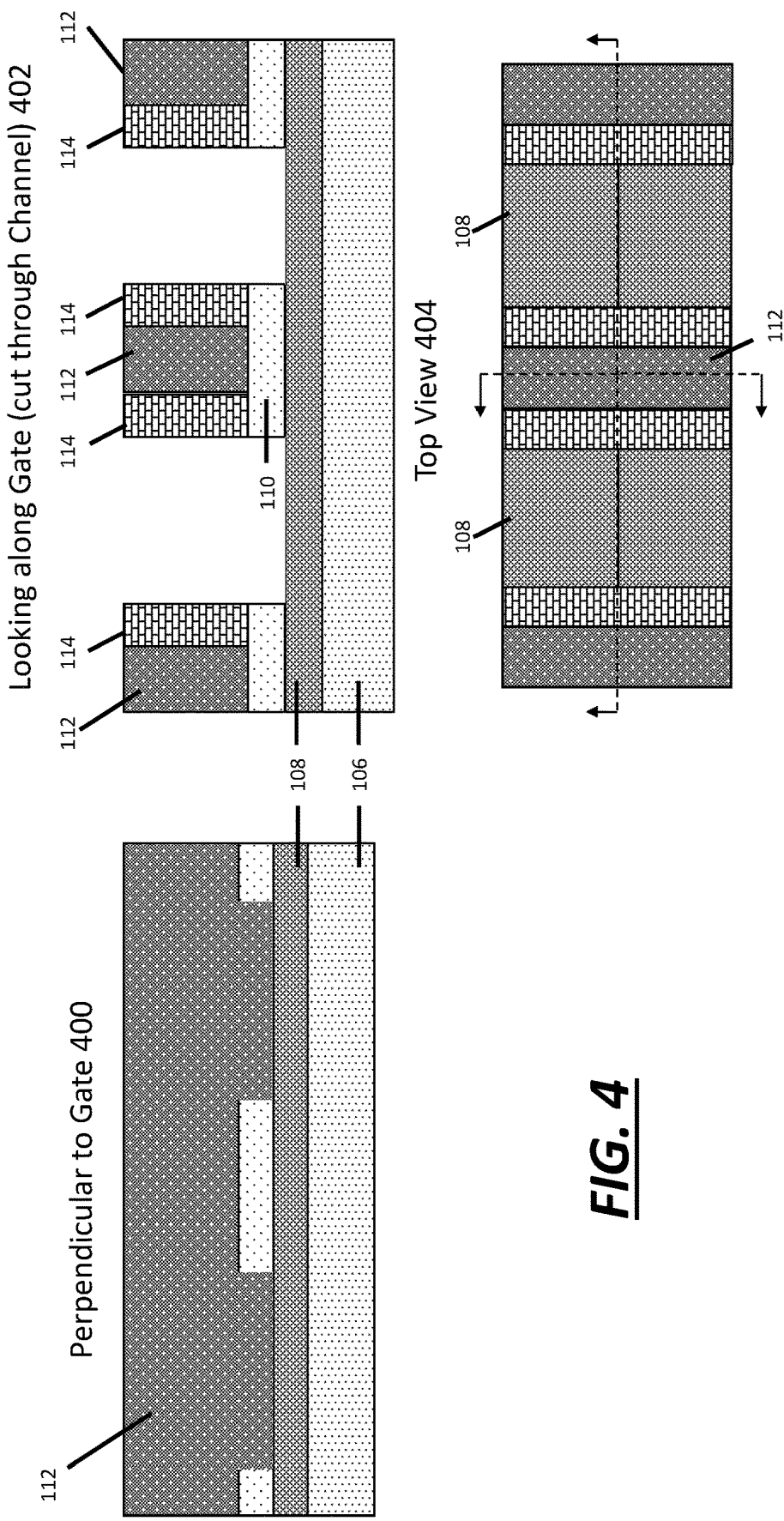

Referring to FIG. 4, illustrated are cross-sectional views 400 and 402 and the top view 404 of the next stage in the process flow. As shown in the cross-sectional view 402, a portion of the sacrificial material 110 in the opening between the second dielectric materials 114 can be etched partially, exposing the seed material 108 in the opening. The sacrificial material 110 can be patterned or etched using any type of suitable etching process, including but not limited to dry etching, wet etching, or plasma etching techniques. In some implementations, the seed material can also be etched directionally to expose the dielectric material 106 in the opening, rather than the seed material 108.

Figure 5:
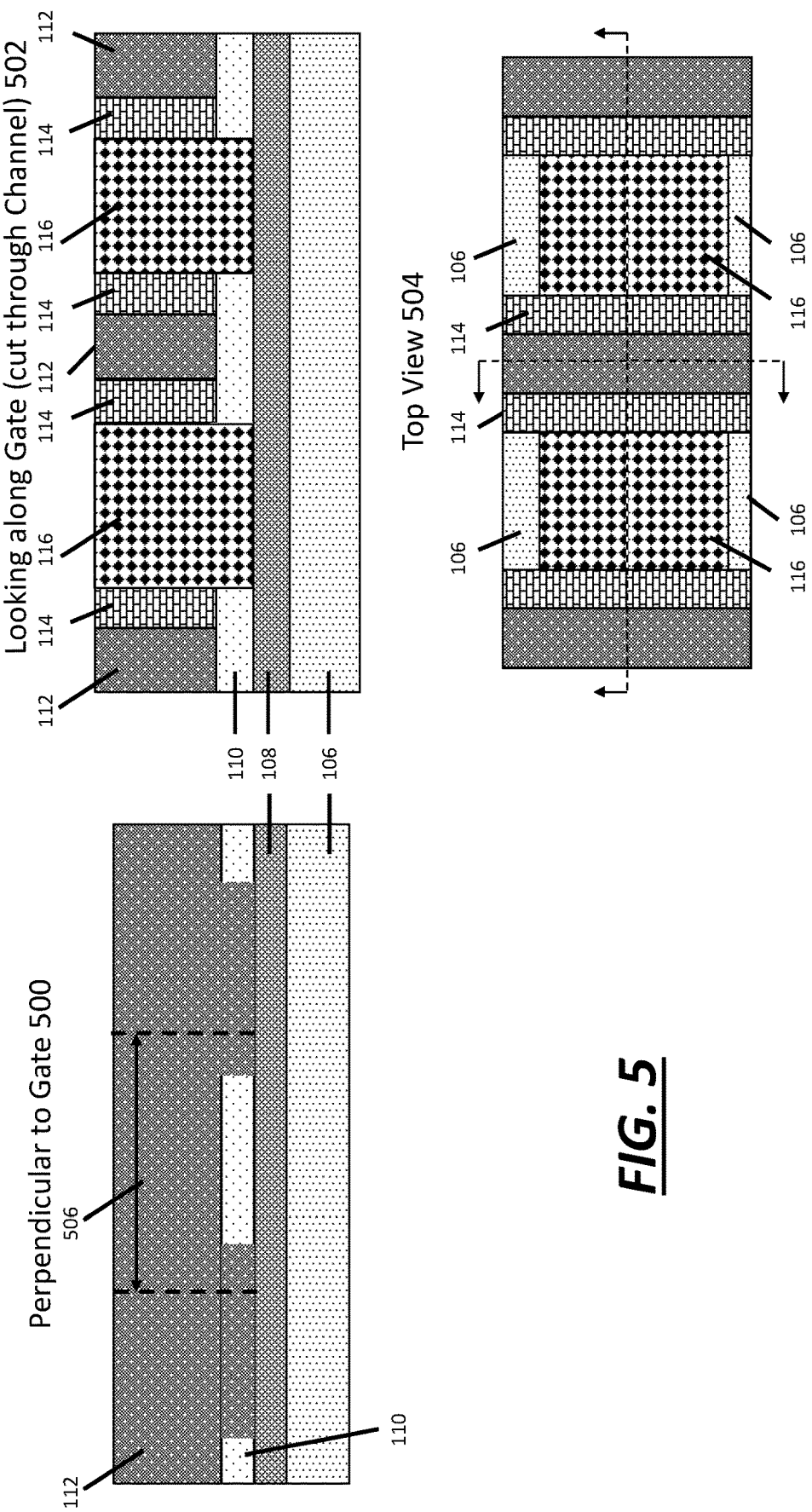
Figure 6:
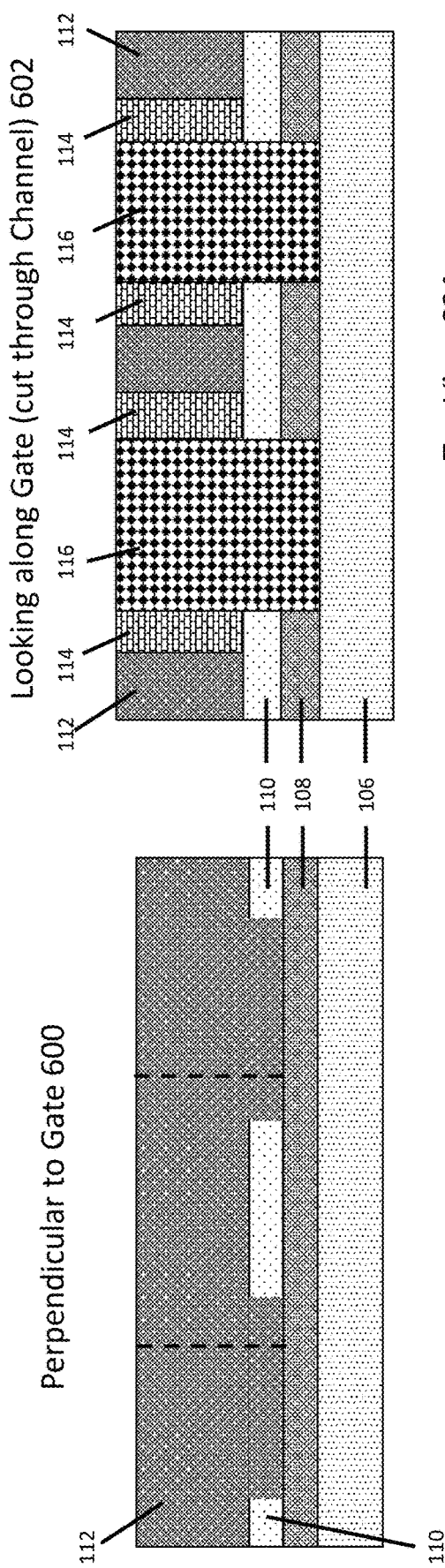
Figure 6:
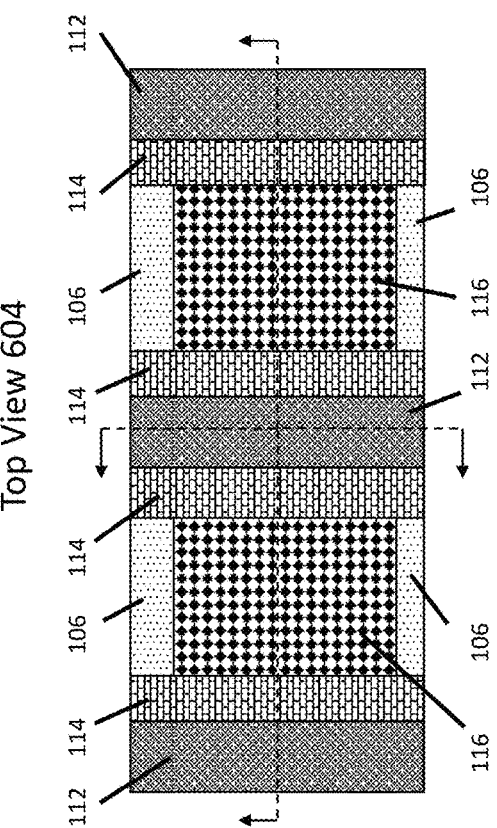

FIGS. 5 and 6 show alternative approaches to forming a contact metal following the process steps described through FIG. 4. Referring to FIG. 5, illustrated are cross-sectional views 500 and 502 and the top view 504 of the next stage in the process flow. As shown, the contact material 116 is deposited or otherwise formed in the opening between the sacrificial material 112 structures. The contact metal 116 may be formed after forming sidewalls in the opening between sacrificial material 112 and dielectric material 114 structures using the first dielectric material 106. To form the sidewalls, the first dielectric material 106 can first be deposited using any suitable material deposition technique, and a chemical-mechanical polish (CMP) process can be performed. Then, a contact opening in the dielectric material 106 can be formed by masking and etching the dielectric 106 using any suitable etching technique. As shown in the cross-sectional view 502, the seed material 108 is still present, and therefore acts as an etch stop for the dielectric 106 that fills the opening. The newly formed contact opening can then be deposit filled with the contact metal 116 using any suitable material deposition technique.

After depositing the contact metal 116, a CMP process may be performed. The contact metal 116 can be any type of metal, and can be formed to contact a portion of the seed material 108, and is surrounded by the dielectric material 106 and the second dielectric material 114. The contact metal 116 can be any suitable type of metal, including gold, platinum, silver, molybdenum, tungsten, or copper, among others. In some implementations, the contact metal 116 can correspond to the type of channel used in the transistors formed in the process flow. For example, W metal may be used for the contact metal 116 if $WS_2$ or $WSe_2$ transistor channels will be used, or Mo metal may be used for the contact metal 116 if $MoS_2$ or $MoSe_2$ channels will be used. The contact metal 116 can be the seed for selective seeded layer growth of the transition metal dichalcogenide (TMD) materials (as used herein, the 2D materials), which serve as the channel for the transistor devices fabricated in this process flow. The contact area 506 of the metal contact 116 is shown in the cross-sectional view 500.

Referring to FIG. 6, illustrated are cross-sectional views 600 and 602 and the top view 604 of an alternative stage in the process flow to that described in connection with FIG. 5. In this alternative approach, the contact metal 116 is formed in substantially the same way as described in connection with FIG. 5, except that the seed material 108 is removed in the opening to expose the base layer of the dielectric material 106. As a result, and as shown in the cross-sectional view 602, when the metal contact 116 is formed in the opening, the metal contact material 116 is coupled to the base layer of the dielectric material 106, rather than the seed material 108. In some implementations, in either of the approaches described in connection with FIGS. 5 and 6, it is possible to cut through the sacrificial material 110 and the seed material 108, and regrow either the sacrificial material 110 or the seed material 108 by selective deposition or epitaxy to make the contact area larger. In addition, in some implementations, in either of the approaches described in connection with FIGS. 5 and 6, it is also possible to cut through the sacrificial material 110 and the seed material 108 and recess the sacrificial material 110 and/or the seed material 108, such that the contact metal 116 slightly undercuts the second dielectric material 114. Recessing only the seed material 108 can be used to "clamp" the contact metal 116 around the regrown channel.

Figure 7:
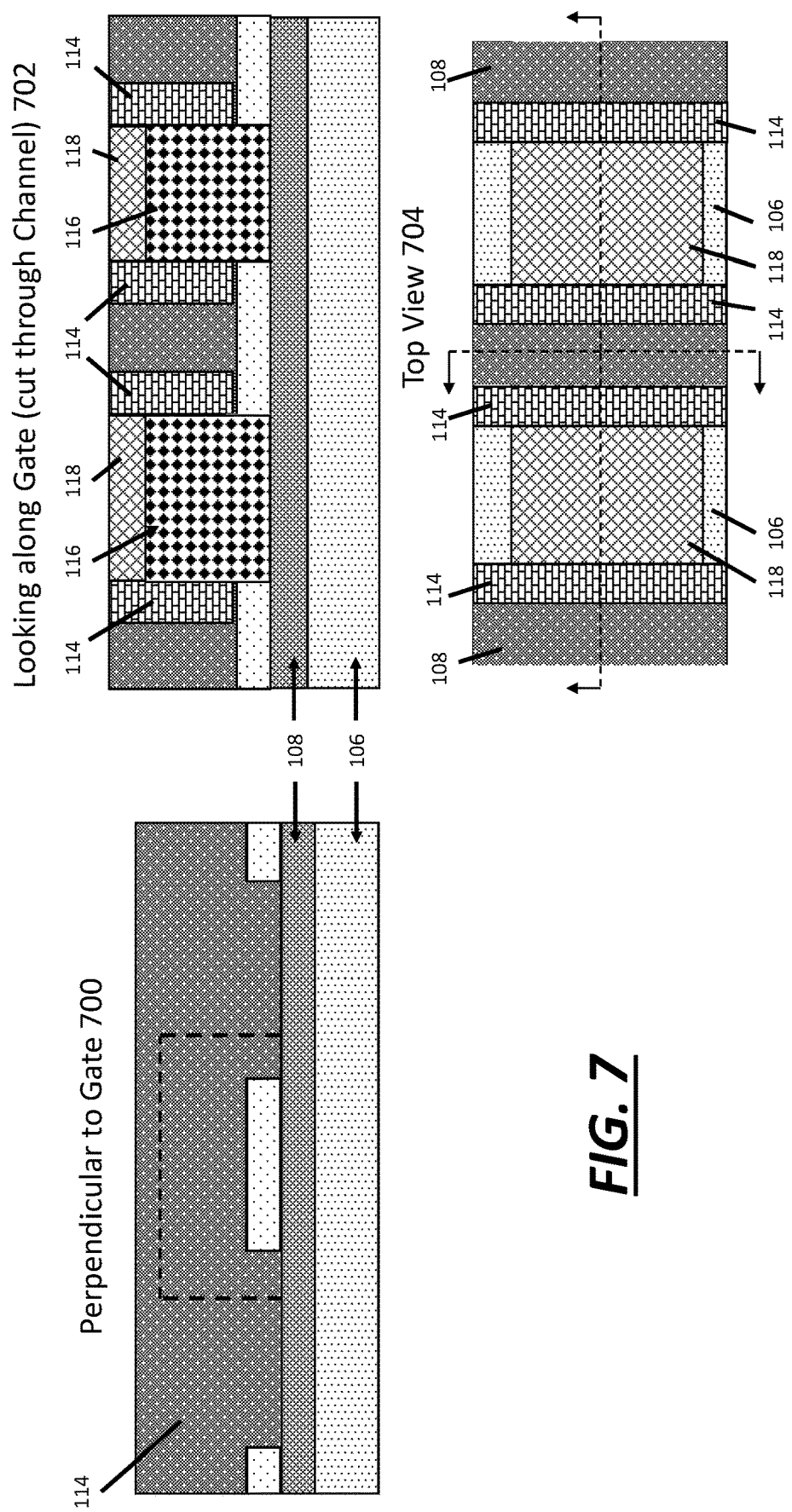

Referring to FIG. 7, illustrated are cross-sectional views 700 and 702 and the top view 704 of the next stage in the process flow, which may follow the process steps described in connection with either FIG. 5 or FIG. 6. Although the process steps from FIG. 7 onward show fabrication following the process flow steps described in connection with FIG. 5, it should be understood that similar steps can be carried out following the process steps described in FIG. 6 with minimal modification. At this stage in the process flow, the contact metal 116 can be partially etched to create a recessed portion at the top of the device. The recessed portion can be bordered by the dielectric material 106 and the second dielectric material 114. The contact metal 116 can be etched or otherwise removed using any suitable etching technique. After etching the contact metal 116, a cap material 118 can be deposited in the recessed portion. The cap material 118 can be any type of metal material, such as gold, silver, copper, tungsten, molybdenum, or in some implementations may be a dielectric material. After depositing the cap material 118, a CMP process may be performed.

Figure 8:
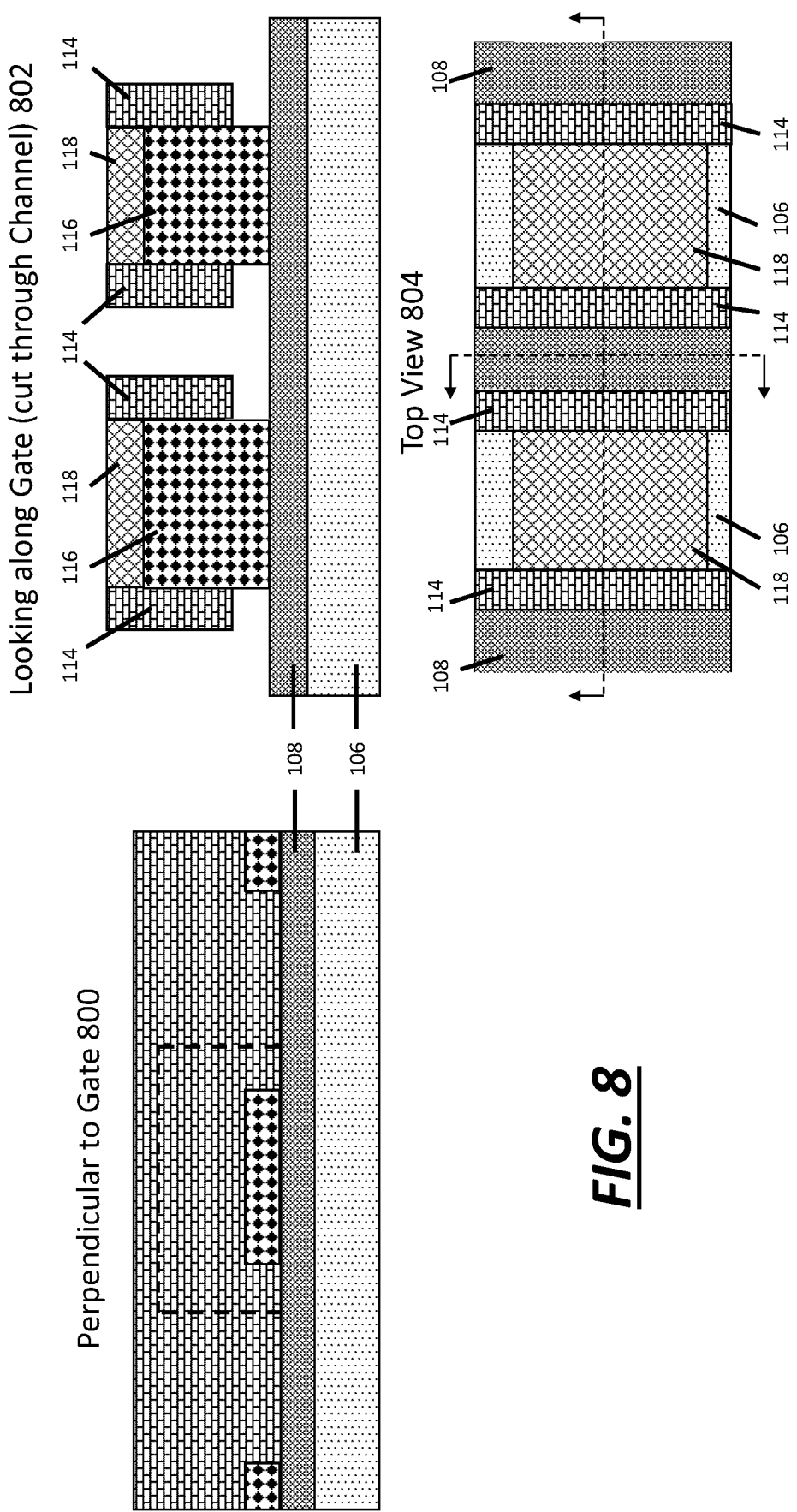

Referring to FIG. 8, illustrated are cross-sectional views 800 and 802 and the top view 804 of the next stage in the process flow. At this stage, as shown, both the sacrificial material 112 and the sacrificial material 110 are removed to expose a portions of the metal contacts 116, as well as a portion of the seed material 108. In some implementations, if multiple types of dummy gate materials are used in additional to the sacrificial material 112, the sacrificial material 112 may be selectively removed, and the stages of the process flow described in connection with FIGS. 8-10 can be repeated to create different types of semiconductor devices (e.g., N-types, P-types, etc.). The sacrificial material 112 and the sacrificial material 110 can be removed using any suitable etching technique, including but not limited to dry etching, wet etching, or plasma etching techniques.

Figure 9:
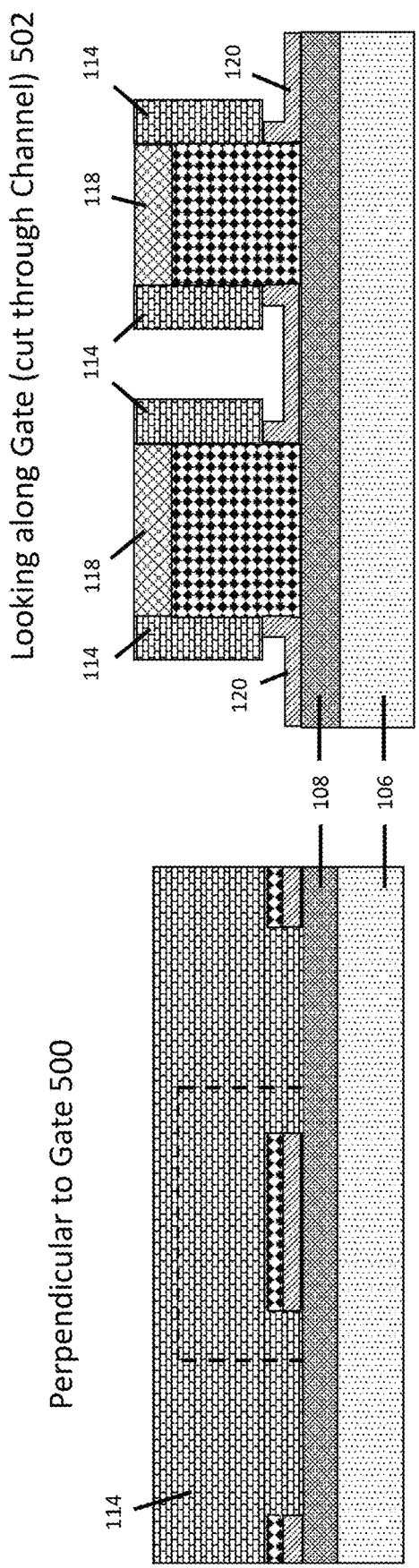
Figure 9:
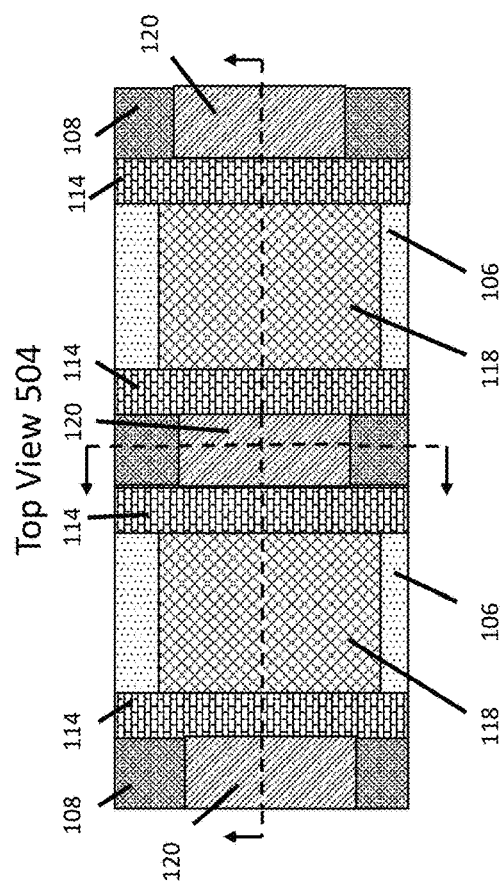

Referring to FIG. 9, illustrated are cross-sectional views 900 and 902 and the top view 904 of the next stage in the process flow. At this stage, a 2D material 120 is formed in the region previously occupied by the sacrificial material 110, such that the 2D material 120 is in contact with the metal contacts 116 and the seed material 108. The 2D material can be any type of suitable TMD material, and may include $WS_2$, $WSe_2$, $MoS_2$, or $MoSe_2$, among others. The 2D material 120 can be formed, for example, by using selective epitaxial growth techniques. For example, initial growth can be started by applying high partial pressure of S or Se to seed the 2D material 120 on the metal contact 116, and then by adding additional amounts of the metal material 116 to continuously grow the 2D material 120 to a desired size. In this way, the contact metal 116 can in part dictate the type of 2D material 120 that is grown. For example, W metal may be used for the contact metal 116 if $WS_2$ or $WSe_2$ will be used for the 2D material 120, or Mo metal may be used for the contact metal 116 if $MoS_2$ or $MoSe_2$ channels will be used for the 2D material 120. The 2D material 120 may then be patterned such that the width of the 2D material 120 matches the width of the previously removed sacrificial material 110, as shown in the top view 904.

Figure 10:
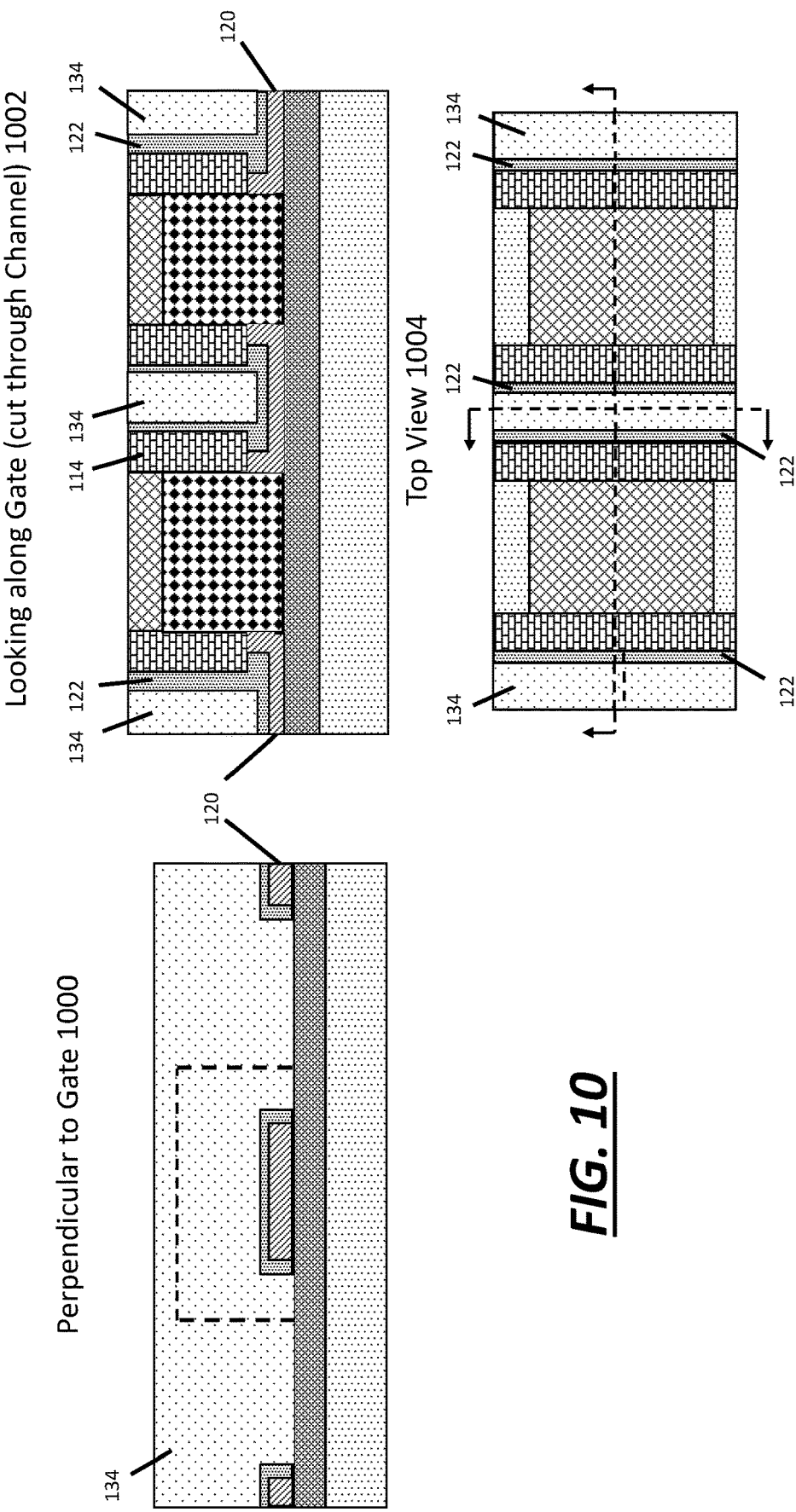

Referring to FIG. 10, illustrated are cross-sectional views 1000 and 1002 and the top view 1004 of the final stage in this process flow. At this stage, a high-k dielectric material 122 is first deposited in the remaining gaps between the second dielectric materials 114, such that the high-k dielectric material 122 is in contact with, and covers, the 2D material. The high-k dielectric material 122 acts as a gate dielectric material for the channel, which is defined by the 2D material 120. The high-k dielectric material 122 can be any type of material with a relatively high dielectric constant, and may be deposited at a predetermined thickness to achieve a desired capacitance. Some examples of high-k dielectric materials 122 can include, but are not limited to, $Si_3N_4$, $Al_2O_3$, $Ta_2O_5$, $TiO_2$, $ZrO_2$, and $HfO_2$. In some implementations, the high-k dielectric material 122 can be selectively deposited or grown, such that the high-k dielectric is deposited only on the second dielectric material 114 and the 2D material 120, and not on the cap material 118. The high-k dielectric material 122 may be deposited using any suitable material deposition technique, including but not limited to ALD, CVD, PVD, or PECVD, among others. Once the high-k dielectric material 122 has been formed on the 2D material, the remaining gap can be filled with a gate metal 134. The gate metal 134 can be any type of metal capable of operating as a gate electrode.

Although not shown here for the sake of simplicity, any of the gate metals 134, the metal contacts 116, or the cap materials 118 can be electrically connected with one another by patterning appropriate traces, vias, or other connections to form desired circuits. Each of the metal contacts 116 can behave as a source or a drain for one or more transistor structures formed using this process flow. Any type of connections may be formed between any types of layers, for example, connections between gate structures to gate structures of other transistor structures, as well as connections between the metal contacts 116 or cap materials 118 to other conductive layers of other transistors. Similarly, it should be understood that the techniques described herein do not require a base layer of silicon, and therefore multiple stacks of material fabricated using the techniques described herein may be formed on top of one another to create large, three-dimensional (3D) stacks of transistor structures. Stacks of N-high transistor structures can be manufactured using the techniques described herein.

Figure 11:
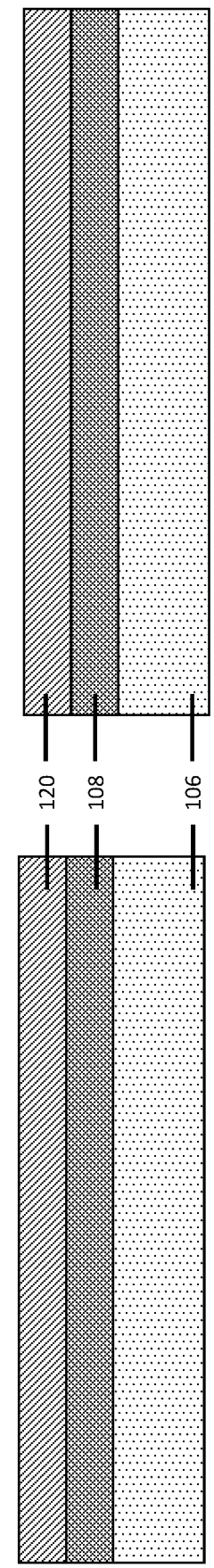
FIGS. 11-18 show various views of a second process flow to integrate 2D materials into a planar semiconductor device, according to an embodiment.
Figure 11:
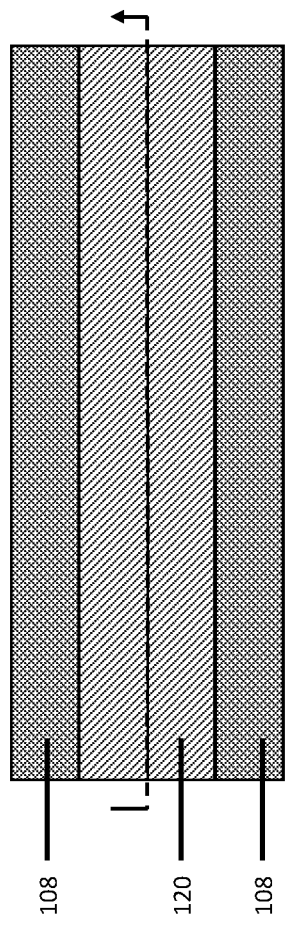

FIGS. 11-18 show various views of a second process flow to integrate 2D materials into a planar semiconductor device, according to an embodiment. Each of the FIGS. 11-18 generally refer to one or more process steps in a process flow, each of which are described in detail in connection with a respective Figure. For the purposes of simplicity and ease of visualization, some reference numbers may be omitted from some Figures. Referring to FIG. 11, illustrated is a first cross-sectional view 1100 that shows a stack of layers perpendicular to where a gate will be formed, a second cross-sectional view 1102 that shows the stack of layers along where the gate will be formed, and a plan view 1104 that depicts the top of the stack of layers. At the start of the process flow, a first layer of dielectric material 106 is formed as a base material (sometimes referred to as a base layer), and a layer of seed material 108 is formed on top of the layer of dielectric material 106.

The dielectric material 106 can be any type of material that can bond with, or otherwise be coupled to, a layer of the seed material 108. The dielectric material 106 can have a relatively high dielectric constant and behave as an insulator. The seed material 108 can be a single crystal semiconductor material (e.g., Si, SiGe, Ge, any III-V or II-VI material, etc.), or any type of insulator material (e.g., oxides, other insulators, etc.). The seed material 108 can be bonded to or transferred onto the first layer of the dielectric material 106. Some further examples of the seed material 108 include hexagonal boron nitride, diamond, or epitaxial dielectric like LaAlO$_x$ or STO, among others. The dielectric 106 may be any type of dielectric material that is capable of being disposed, patterned, or otherwise provided as a base layer. Some examples of dielectric materials can include, but are not limited to, oxide materials. A layer of a 2D material 120 can be formed on top of the seed material 108. The width of the 2D material 120 can define the width of the channel of one or more transistor structures, and can be defined by lithography or patterning techniques for replacement gate integration. The 2D material 120 may be patterned to create one or more segmented channel transistors. The 2D material 120 can be grown, deposited (e.g., using processes such as ALD, CVD, PVD, or PECVD, etc.), or otherwise formed on the layer of seed material 108. The 2D material can be any type of suitable TMD material, and may include WS$_2$, WSe$_2$, MoS$_2$, or MoSe$_2$, among others.

Figure 12:
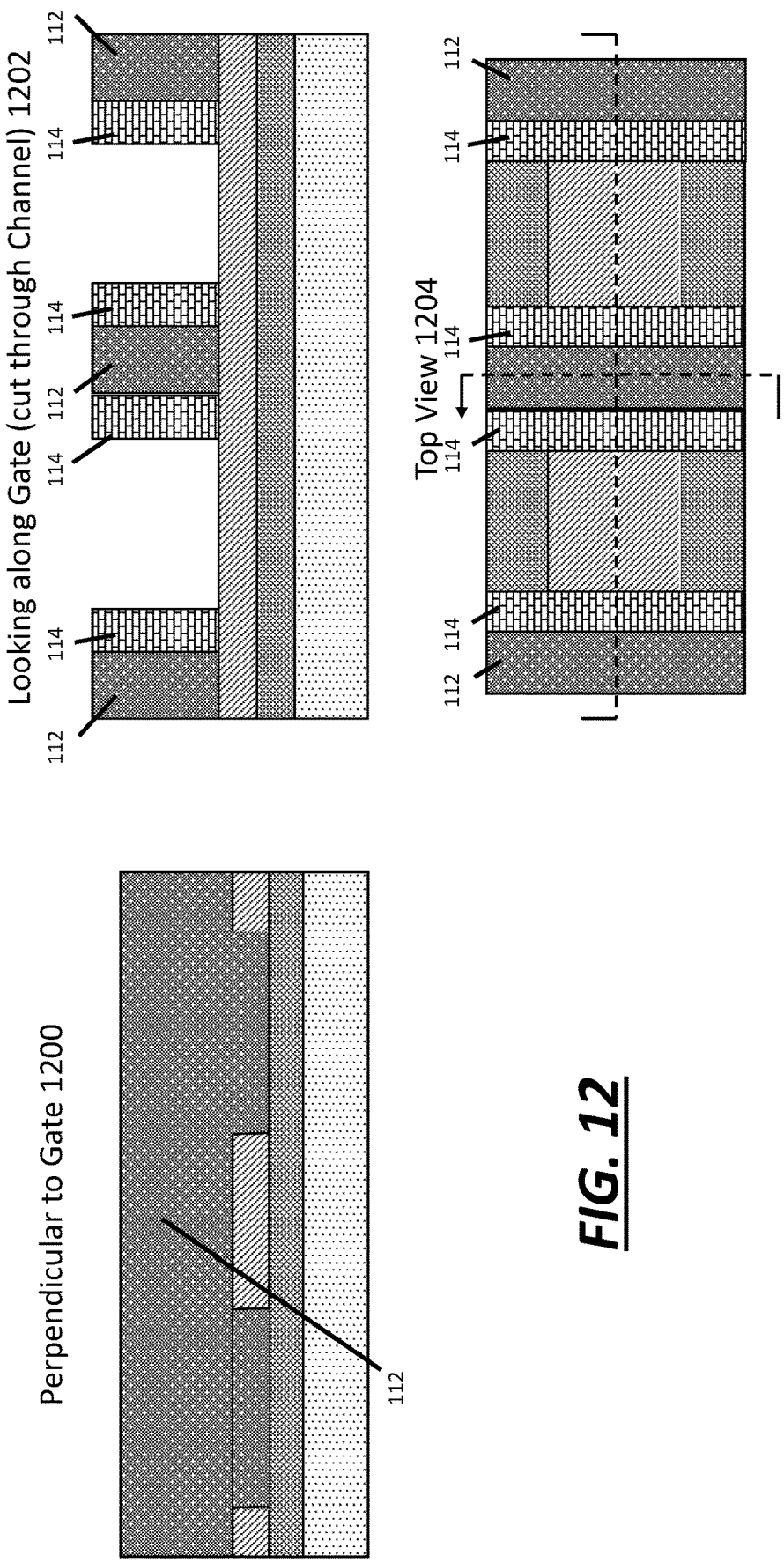

Referring to FIG. 12, illustrated are cross-sectional views 1200 and 1202 and a top view 1204 of the next stage in the process flow. At this stage, a sacrificial material 112 (or other similar, suitable material) can be deposited to form a "dummy gate," or a region of material that occupies a volume that will layer be replaced with a gate (including high-k dielectric materials). Note that the cross sectional view 1200 shows multiple strips of the 2D material 120, indicating that the steps in the process flow can be performed to define several transistors in multiple directions along the sheet of the seed material 108. The sacrificial material 112 can first be deposited using any suitable material deposition technique, including ALD, CVD, PVD, or PECVD, among others. The sacrificial material 112 can be patterned using a suitable mask to define one or more openings that expose portions of the 2D material 120 and the seed material 108. In some implementations, a layer of the sacrificial material 112 can be formed, and then etched to form the openings shown in the cross-sectional view 1202 and the top view 1204. In some implementations, multiple types of material may be used in place of the sacrificial material 112 to leverage AB selectively to form different types of gates (e.g., for N-type or P-type transistors). For example, a region that will have a first type of gate may be formed with the sacrificial material 112, while a region that will have a different type of gate may be filled with a different type of material.

A second dielectric material 114 can then be formed in the openings, which contacts a portion of the both the 2D material 120 and the seed material 108, as shown in the cross-sectional view 1202 and the top view 1204. The second dielectric material 114 can be formed using any suitable material deposition technique, including ALD, CVD, PVD, or PECVD, among others. In some implementations, the second dielectric material 114 can be deposited to fill the openings defined between the sacrificial material 112, and subsequently etched using a suitable etching technique to expose the 2D material 120 and the seed material 108, as shown.

Figure 13:
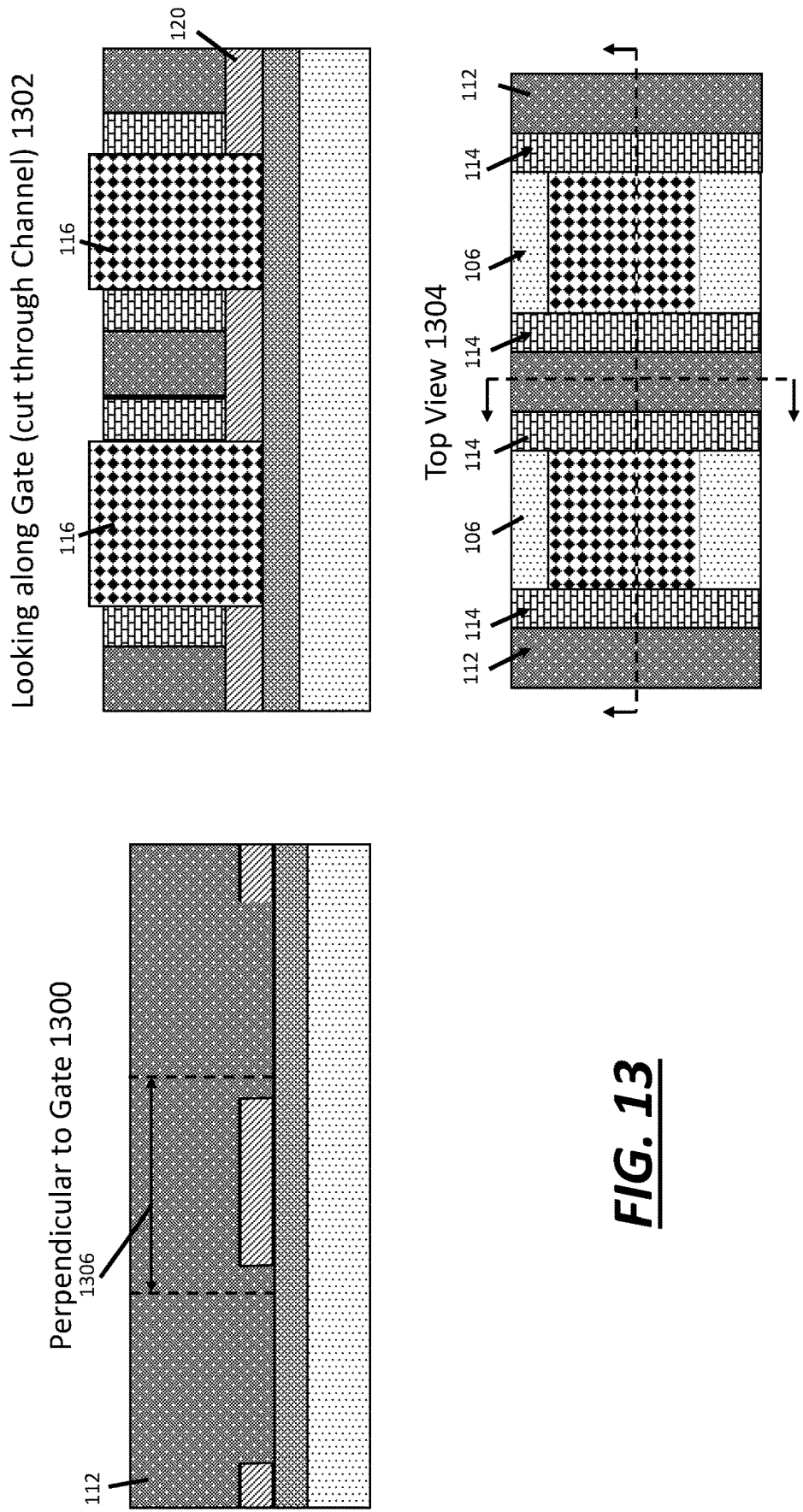
Figure 14:
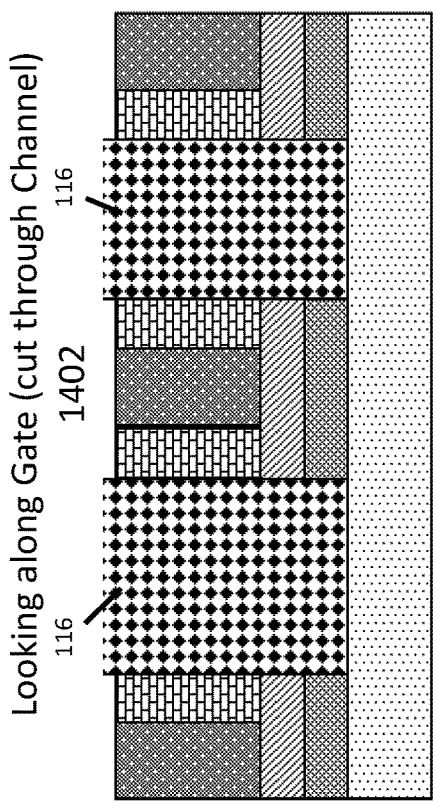
Figure 14:
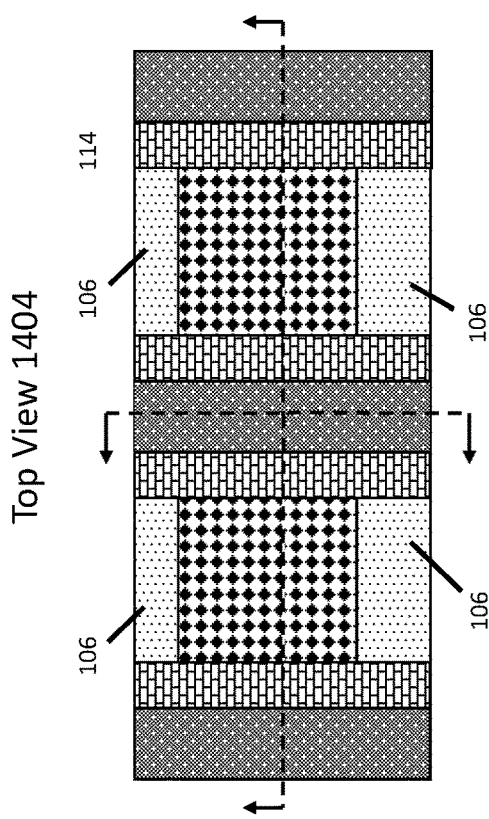
Figure 14:
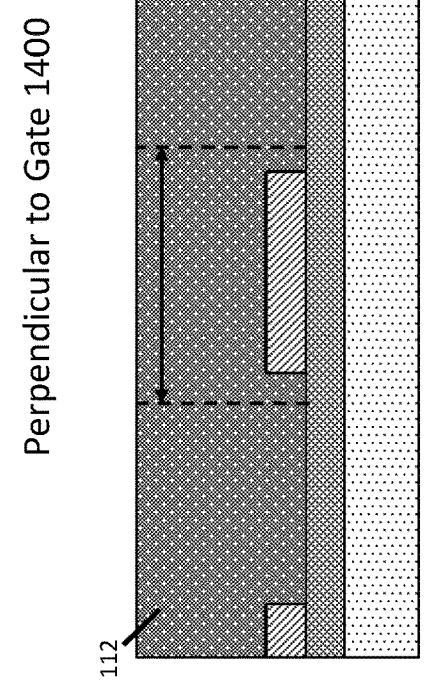

FIGS. 13 and 14 show alternative approaches to forming a contact metal following the process steps described through FIG. 12. Referring to FIG. 13, illustrated are cross-sectional views 1300 and 1302 and the top view 1304 of the next stage in the process flow. As shown, the contact metal 116 is deposited or otherwise formed in the opening after forming sidewalls in the opening using the first dielectric material 106. To form the contact metal 116, the first dielectric material 106 can first be deposited in the opening using any suitable material deposition technique, and a CMP process can be performed. Then, a contact opening in the dielectric material 106 can be formed by masking and etching the dielectric 106 using any suitable etching technique. As shown in the cross-sectional view 1302, the seed material 108 is still present and therefore acts as an etch stop for the dielectric 106 that filled the opening. The newly formed contact opening can then be deposit filled with the contact metal 116 using any suitable material deposition technique. As shown in the cross-sectional view 1302, the contact metal 116 is in contact with the 2D material 120.

After depositing the contact metal 116, a CMP process may be performed. The contact metal 116 can be any type of metal and can be formed to contact a portion of the seed material 108, and is surrounded by the dielectric material 106 and the second dielectric material 114. The contact metal 116 can be any suitable type of metal, including gold, platinum, silver, molybdenum, tungsten, or copper, among others. The contact area 1306 of the metal contact 116 is shown in the cross-sectional view 1300.

Referring to FIG. 14, illustrated are cross-sectional views 1400 and 1402 and the plan view 1404 of an alternative stage in the process flow to that described in connection with FIG. 13. In this alternative approach, the contact metal 116 is formed in substantially the same way as described in connection with FIG. 13, except that the seed material 108 is removed in the opening to expose the base layer of the dielectric material 106. As a result, and as shown in the cross-sectional view 1402, when the contact metal 116 is formed in the opening, the metal contact material 116 is coupled to the base layer of the dielectric material 106, rather than the seed material 108. In some implementations, in either of the approaches described in connection with FIGS. 13 and 14, it is also possible to cut through the 2D material 120 and the seed material 108, and recess the 2D material 120 and/or the seed material 108, such that the contact metal 116 slightly undercuts the second dielectric material 114.

Figure 15:
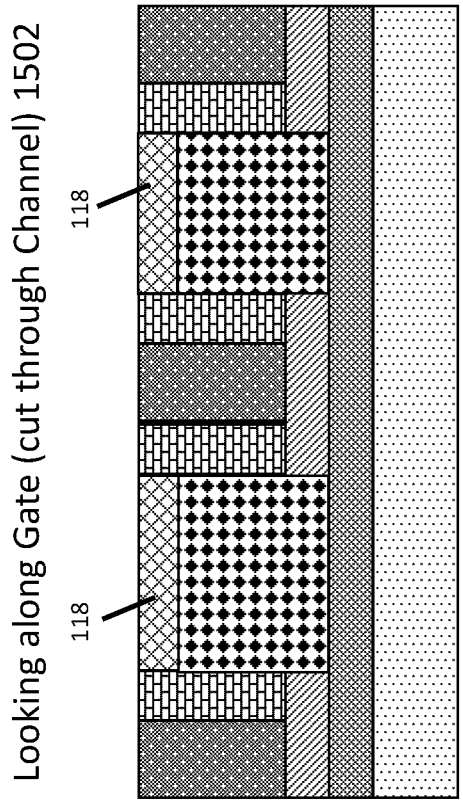
Figure 15:
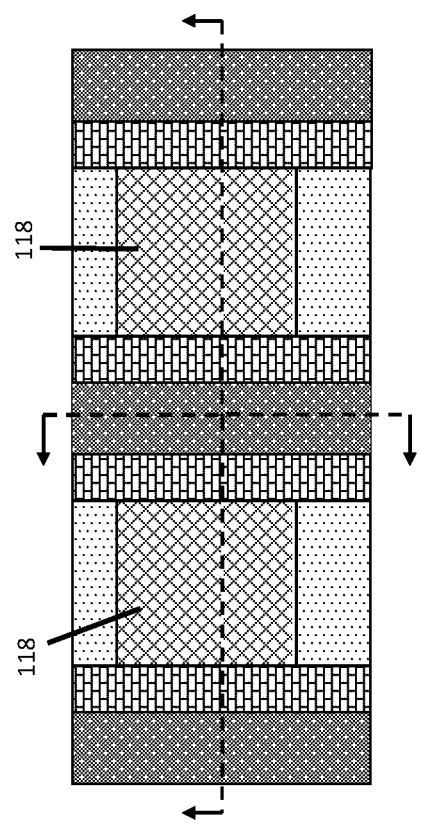
Figure 15:
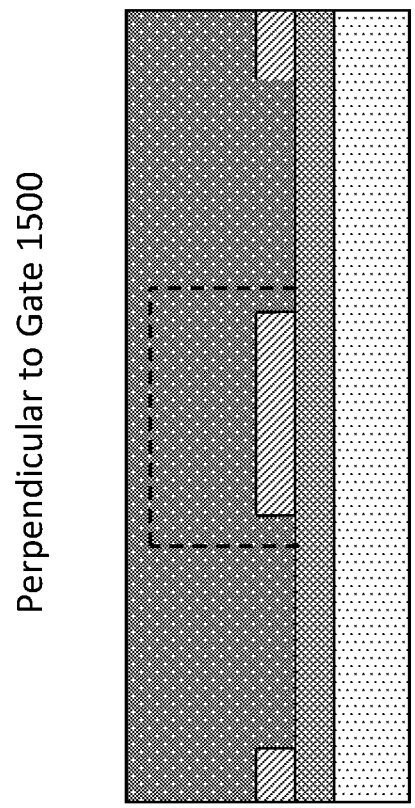

Referring to FIG. 15, illustrated are cross-sectional views 1500 and 1502 and the top view 1504 of the next stage in the process flow, which may follow the process steps described in connection with either FIG. 13 or FIG. 14. Although the process steps from FIG. 15 onward show fabrication following the process flow steps described in connection with FIG. 13, it should be understood that similar steps can be carried out following the process steps described in FIG. 14 with minimal modification. At this stage in the process flow, the contact metal 116 can be partially etched to create a recessed portion at the top of the device. The recessed portion can be bordered by the dielectric material 106 and the second dielectric material 114. The contact metal 116 can be etched or otherwise removed using any suitable etching technique. After etching the contact metal 116, a cap material 118 can be deposited in the recessed portion. The cap material 118 can be any type of metal material, such as gold, silver, copper, tungsten, molybdenum, or in some implementations may be a dielectric material. After depositing the cap material 118, a CMP process may be performed.

Figure 16:
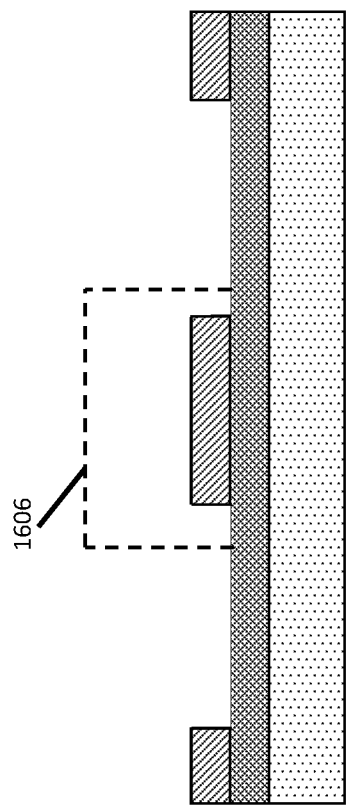
Figure 16:
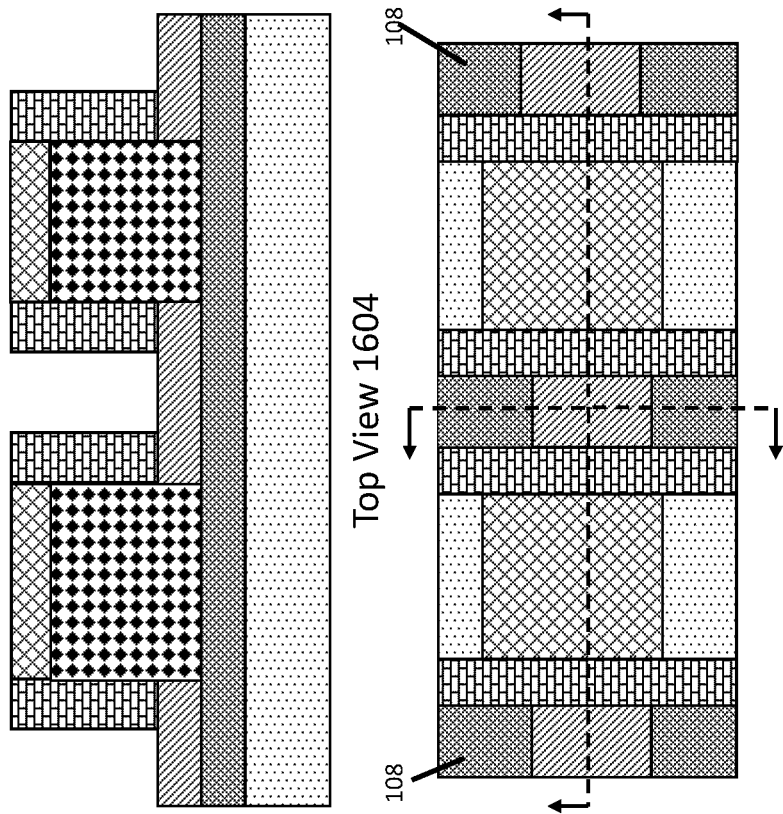

Referring to FIG. 16, illustrated are cross-sectional views 1600 and 1602 and the top view 1604 of the next stage in the process flow. At this stage, as shown, the sacrificial material 112 is removed to expose a portion of the 2D material 120 as well as a portion of the seed material 108. In some implementations, if multiple types of dummy gate materials are used in additional to the sacrificial material 112, the sacrificial material 112 may be selectively removed, and the stages of the process flow described in connection with FIGS. 16-18 can be repeated to create different types of semiconductor devices (e.g., N-types, P-types, etc.). The sacrificial material 112 can be removed using any suitable etching technique, including but not limited to dry etching, wet etching, or plasma etching techniques.

Figure 17:
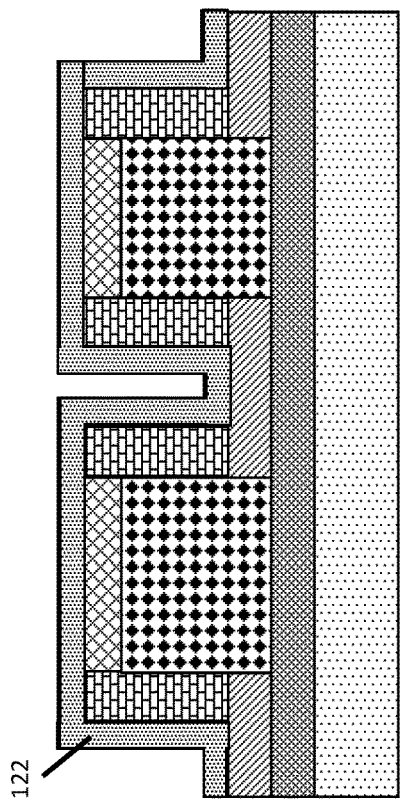
Figure 17:
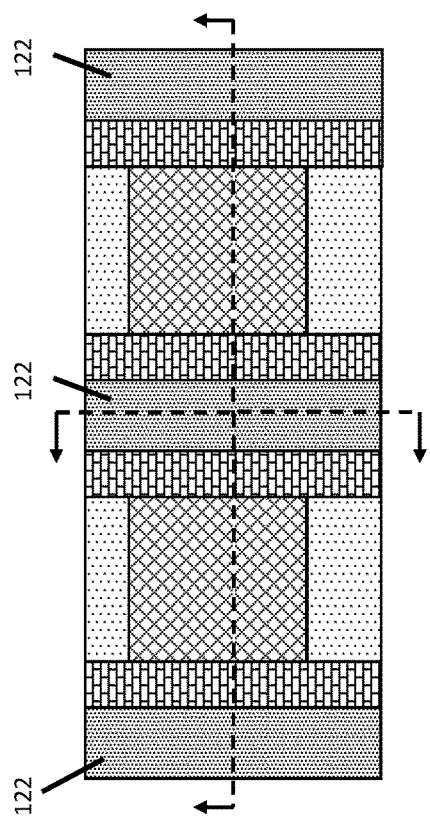
Figure 17:
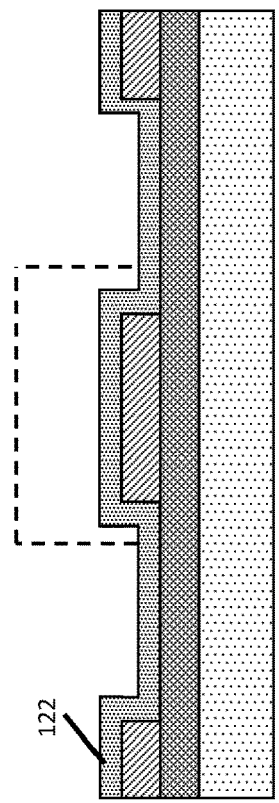

Referring to FIG. 17, illustrated are cross-sectional views 1700 and 1702 and the top view 1704 of the next stage in the process flow. At this stage, a high-k dielectric material 122 can deposited in the gaps between the second dielectric materials 114, such that the high-k dielectric material 122 is in contact with, and covers, the 2D material 120 and the seed material 108. The high-k dielectric material 122 acts as a gate dielectric material for the channel, which is defined by the 2D material 120. The high-k dielectric material 122 can be any type of material with a relatively high dielectric constant, and may be deposited at a predetermined thickness to achieve a desired capacitance. Some examples of high-k dielectric materials 122 can include, but are not limited to, $Si_3N_4$, $Al_2O_3$, $Ta_2O_5$, $TiO_2$, $ZrO_2$, and $HfO_2$. In some implementations, the high-k dielectric material 122 can be selectively deposited or grown, such that the high-k dielectric is deposited only on the second dielectric material 114, the 2D material 120, and the seed material 108. The high-k dielectric material 122 may be deposited using any suitable material deposition technique, including but not limited to ALD, CVD, PVD, or PECVD, among others. As shown in the cross sectional view 1702, the high-k dielectric material 122 may cover the top of the device, any may subsequently be selectively etched to remove the high-k dielectric from undesirable areas.

Figure 18:
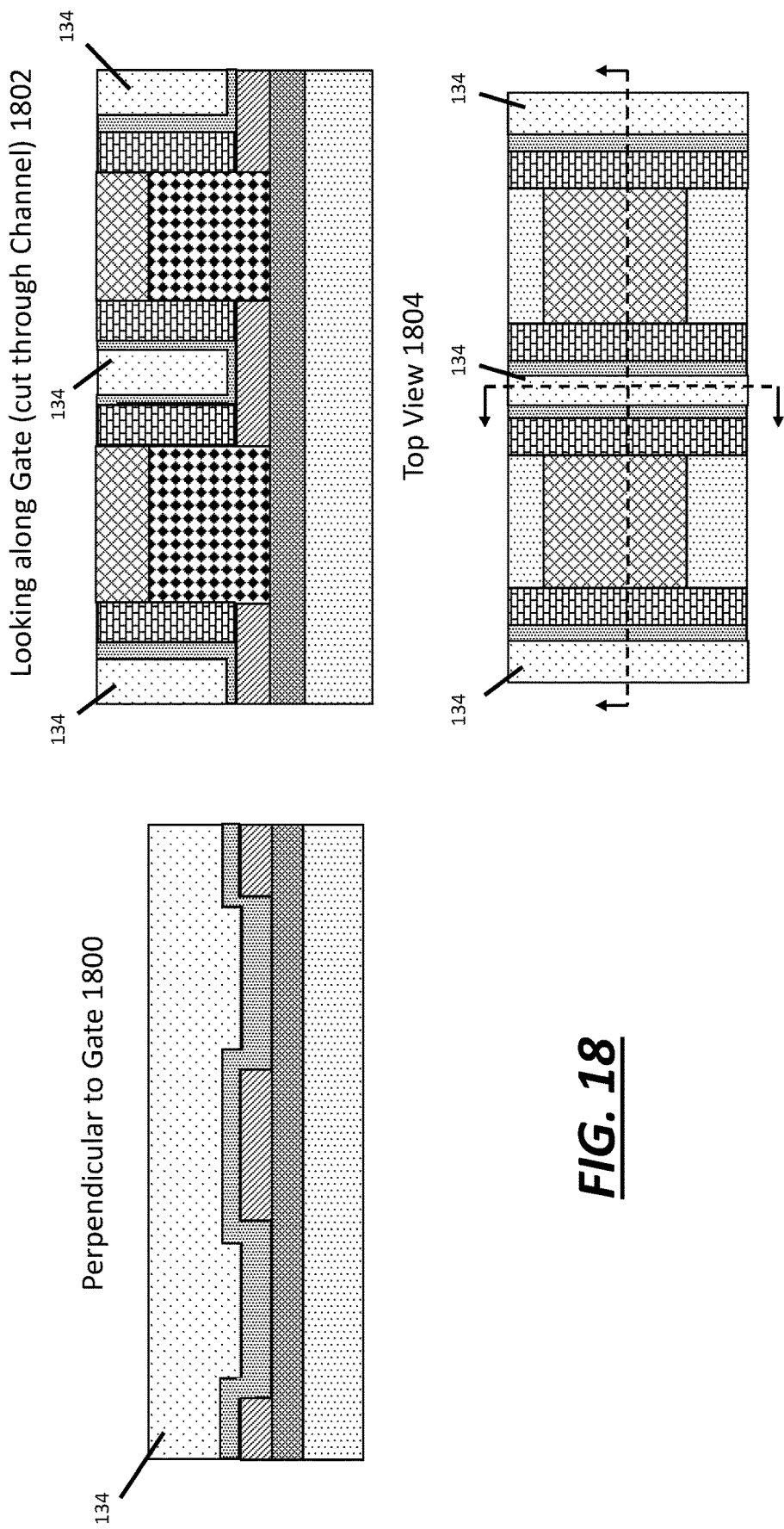

Referring to FIG. 18, illustrated are cross-sectional views 1800 and 1802 and the top view 1804 of the next stage in the process flow. Once the high-k dielectric material 122 has been formed on the 2D material 120, the remaining gap can be filled with a gate metal 134. The gate metal 134 can be any type of metal capable of operating as a gate electrode. Some example gate metals 134 include, but are not limited to, gold, silver, platinum, or copper, among others. Although not shown here for the sake of simplicity, any of the gate metals 134, the metal contacts 116, or the cap materials 118 can be electrically connected with one another by patterning appropriate traces, vias, or other connections to form desired circuits. Each of the metal contacts 116 can behave as a source or a drain for one or more transistor structures formed using this process flow. Any type of connections may be formed between any types of layers, for example, connections between gate structures to gate structures of other transistor structures, as well as connections between the metal contacts 116 or cap materials 118 to other conductive layers of other transistors. Similarly, it should be understood that the techniques described herein do not require a base layer of silicon, and therefore multiple stacks of material fabricated using the techniques described herein may be formed on top of one another to create large, 3D stacks of transistor structures. Stacks of N-high transistor structures can be manufactured using the techniques described herein.

Figure 19:
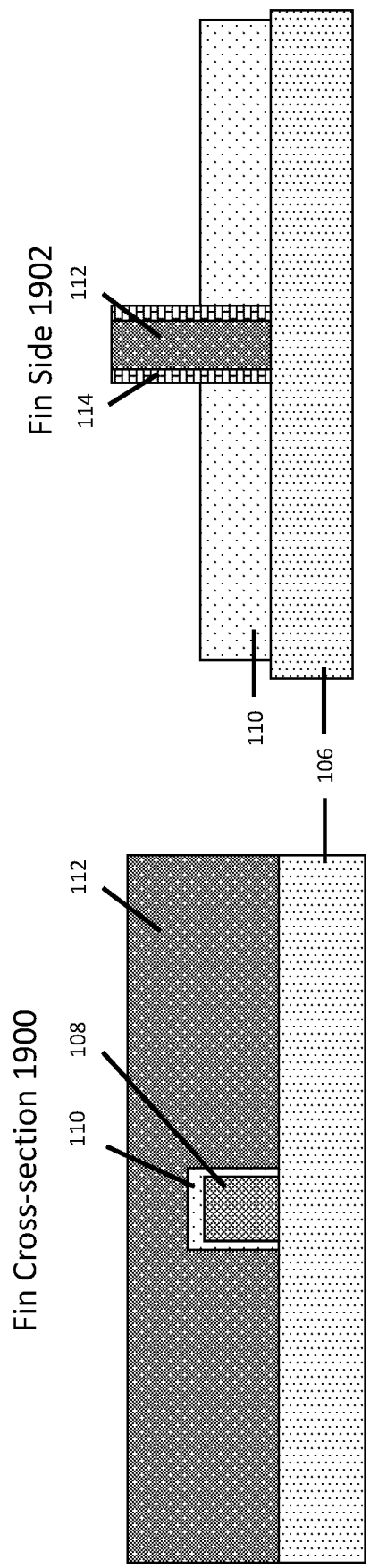
FIGS. 19-24 show various views of a third process flow to integrate 2D materials into a fin field-effect transistor (FinFET) device, according to an embodiment.

FIGS. 19-24 show various views of a third process flow to integrate 2D materials into a FinFET device, according to an embodiment. Referring to FIG. 19, illustrated is a first cross-sectional view 1900 facing the front of the fin of a FinFET configuration, and second cross-sectional side view 1902 that shows the side of the fin of the FinFET configuration. At the start of the process flow, a first layer of dielectric material 106 is formed as a base material (sometimes referred to as a base layer), and a layer of seed material 108 is formed on top of the layer of dielectric material 106. The dielectric material 106 can be any type of material that can bond with, or otherwise be coupled to, a layer of the seed material 108. The dielectric material 106 can have a relatively high dielectric constant and behave as an insulator.

As shown, the seed material 108 can be patterned and deposited (or grown) using any suitable material deposition technique, such that the seed material 108 forms a "fin," or a rectangular structure with a majority of its length formed along a first axis. The seed material 108 can be patterned to have a predetermined width, height, and length. As shown, the length of the seed material 108 is substantially larger than its width or height and is formed along a first axis. The seed material 108 can be a single crystal semiconductor material (e.g., Si, SiGe, Ge, any III-V or II-VI material, etc.) or any type of insulator material (e.g., oxides, other insulators, etc.). The seed material 108 can be bonded to or transferred onto the first layer of the dielectric material 106. Some further examples of the seed material 108 include hexagonal boron nitride, diamond, or epitaxial dielectric like $LaAlO_x$ or STO, among others. A layer of a sacrificial material 110 is formed on top of the seed material 108, such that the sacrificial material 110 surrounds the seed material 108 and contacts the base layer of the dielectric material 106. The sacrificial material 110 can be any type of material that is capable of being removed in further process steps and may include metals, metal oxides, semiconductor materials, or dielectric materials. The layer of the first sacrificial material 110 can be grown epitaxially or deposited (e.g., using processes such as ALD, CVD, PVD, or PECVD, etc.), or otherwise formed on the fin of seed material 108.

After forming the stack of layers, a sacrificial material 112 (or other similar, suitable material) can be deposited to form a "dummy gate," or a region of material that occupies a volume that will layer be replaced with a gate (including high-k dielectric materials). The sacrificial material 112 can first be deposited using any suitable material deposition technique, including ALD, CVD, PVD, or PECVD, among others. The sacrificial material 112 can be patterned using a suitable mask to define one or more openings that expose portions of the sacrificial material 110 and the dielectric material 106. In some implementations, a layer of the sacrificial material 112 can be formed, and then etched to form the openings. In some implementations, multiple types of material may be used in place of the sacrificial material 112 to leverage AB selectively to form different types of gates (e.g., for N-type or P-type transistors). For example, a region that will have a first type of gate may be formed with the sacrificial material 112, while a region that will have a different type of gate may be filled with a different type of material.

A second dielectric material 114 can then be formed in the openings between the structures of the sacrificial material 112, which contacts a portion of the both the sacrificial material 110 and the dielectric material 108, as shown in the cross-sectional view 1900 and the side view 1902. The second dielectric material 114 can be formed using any suitable material deposition technique, including ALD, CVD, PVD, or PECVD, among others. In some implementations, the second dielectric material 114 can be deposited to fill the openings defined between the sacrificial material 112, and subsequently etched using a suitable etching technique to expose the sacrificial material 110 and the dielectric material 106, as shown. Although only one of the sacrificial material 112 structures is shown in FIG. 19 for simplicity, it should be understood that any number of polysilicon material (e.g., or another sacrificial material) structures (and corresponding dielectric material 114) can be formed, as will be shown in further figures in this process flow.

Figure 20:
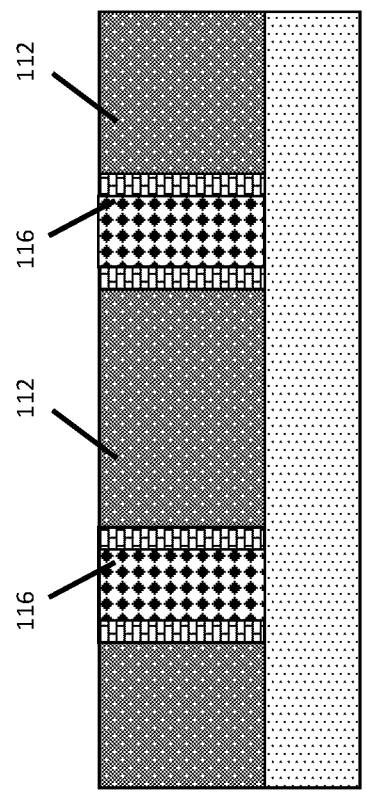
Figure 20:
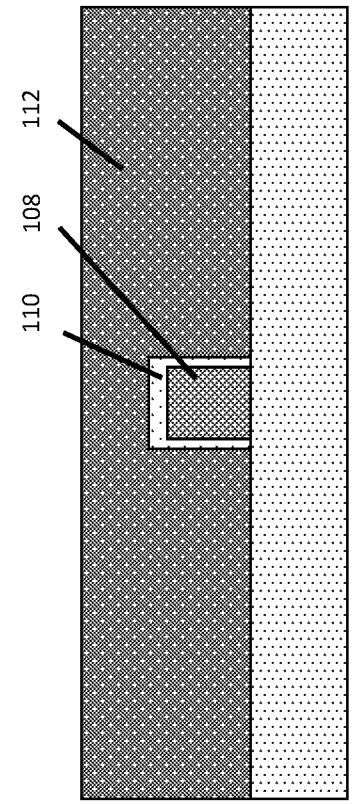

Referring to FIG. 20, illustrated is a cross-sectional view 2000 and a side view 2002 of the next stage in the process flow. As shown, the contact metal 116 is deposited or otherwise formed in the opening between the sacrificial material 112 structures. The contact metal 116 may be formed after forming sidewalls in the opening between sacrificial material 112 and dielectric material 114 structures using the first dielectric material 106. To form the sidewalls, the first dielectric material 106 can be deposited to fill the opening using any suitable material deposition technique, and CMP process can be performed. Then, a contact opening in the dielectric material 106 can be formed by masking and etching the dielectric 106 using any suitable etching technique. The newly formed contact opening can then be deposit-filled with the contact metal 116 using any suitable material deposition technique. Once deposited, the contact metal 116 will be in contact with the sacrificial material 110.

After depositing the contact metal 116, a CMP process may be performed. The contact metal 116 can be any type of metal, and may be surrounded by the dielectric material 106 and the second dielectric material 114. The contact metal 116 can be any suitable type of metal, including gold, platinum, silver, molybdenum, tungsten, or copper, among others. In some implementations, the contact metal 116 can correspond to the type of channel used in the transistors formed in the process flow. For example, W metal may be used for the contact metal 116 if $WS_2$ or $WSe_2$ transistor channels will be used, or Mo metal may be used for the contact metal 116 if $MoS_2$ or $MoSe_2$ channels will be used. The metal contact 116 can be the seed for selective seeded layer growth of TMD materials (e.g., the 2D materials 120), which serve as the channel for the transistor devices fabricated in this process flow.

Figure 21:
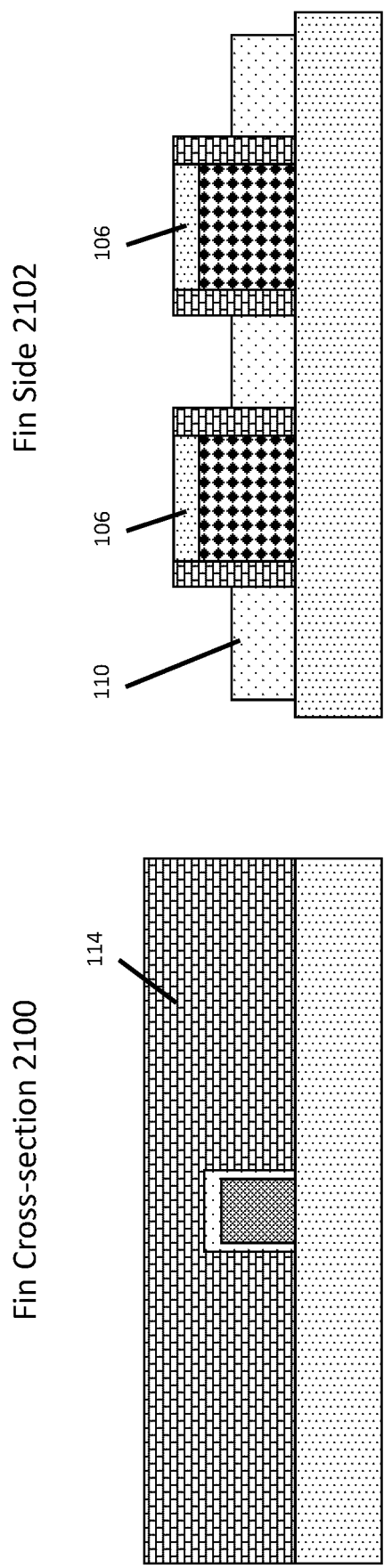

Referring to FIG. 21, illustrated is a cross-sectional view 2100 and a side view 2102 of the next stage in the process flow. At this stage in the process flow, the contact metal 116 can be partially etched to create a recessed portion at the top of the device. The recessed portion may be bordered by the dielectric material 106 and the second dielectric material 114. The portion of contact metal 116 can be etched or otherwise removed using any suitable etching technique. After etching to recess a portion of the contact metal 116, the dielectric material 106 can be deposited in the recessed portion. After depositing the dielectric material 106, a CMP process may be performed. Next, the sacrificial material 112 can be removed to expose a portions of the sacrificial material 110, as well as a portion of the base layer of the dielectric material 106. The sacrificial material 112 can be removed using any suitable etching technique, including but not limited to dry etching, wet etching, or plasma etching techniques.

Figure 22:
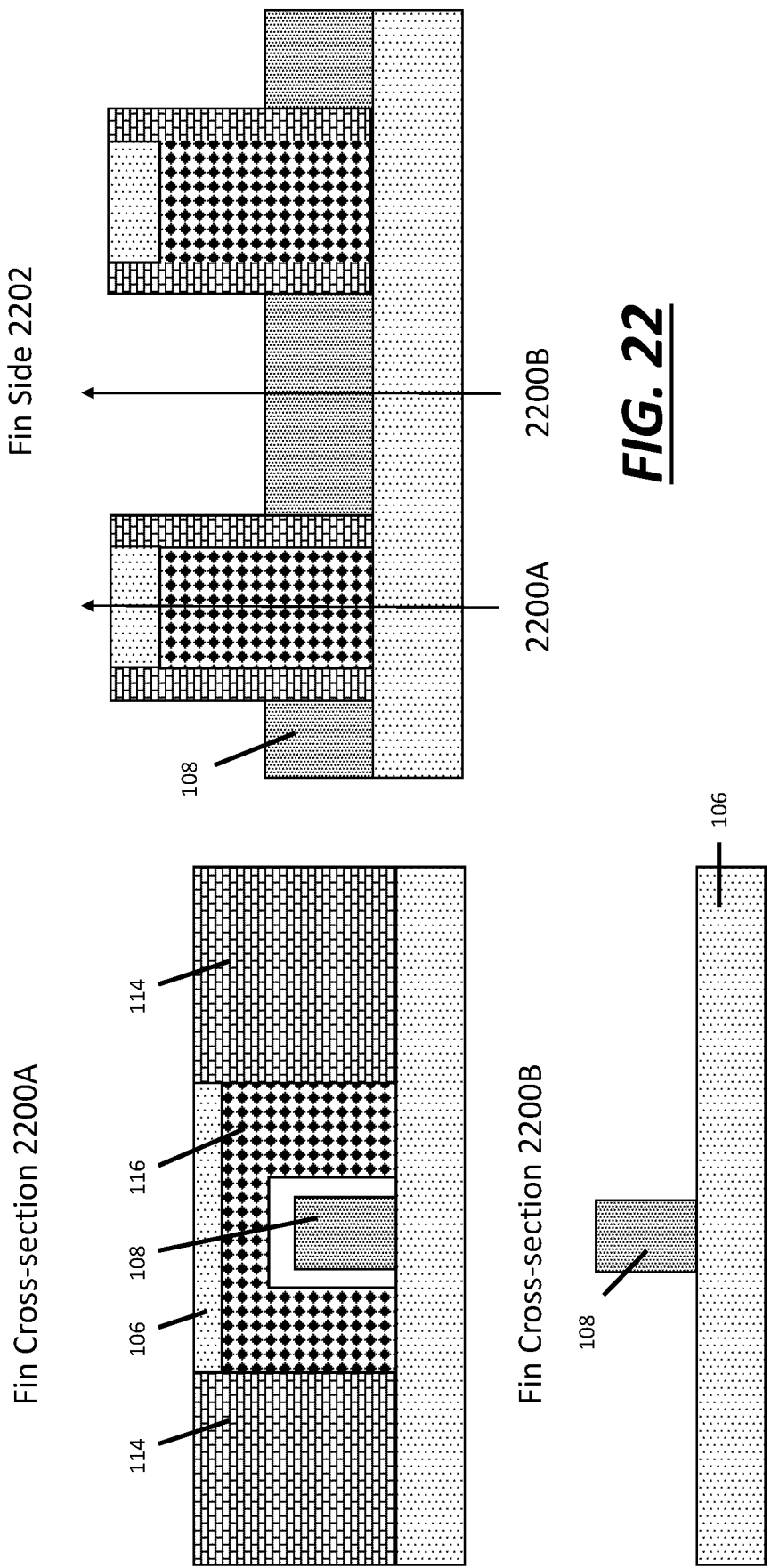

Referring to FIG. 22, illustrated are cross-sectional views 2200A and 2200B, and a side view 2202, of the next stage in the process flow. At this stage, the sacrificial material 110 is removed to expose a portions of the metal contacts 116, as well as a portion of the seed material 108. The sacrificial material 110 can be removed using any suitable etching technique, including but not limited to dry etching, wet etching, or plasma etching techniques. As shown in the cross-sectional view 2200A, this creates an air gap between the metal contact metal 116 and the surface of the seed material 108.

Figure 23:
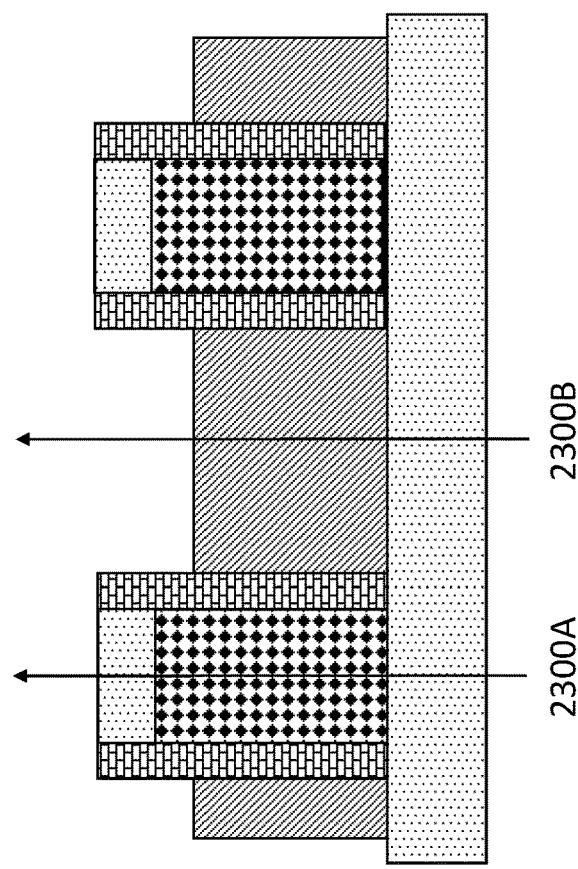
Figure 23:
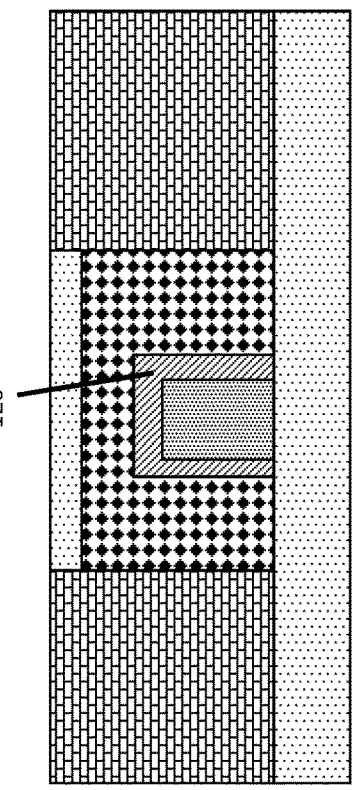
Figure 23:
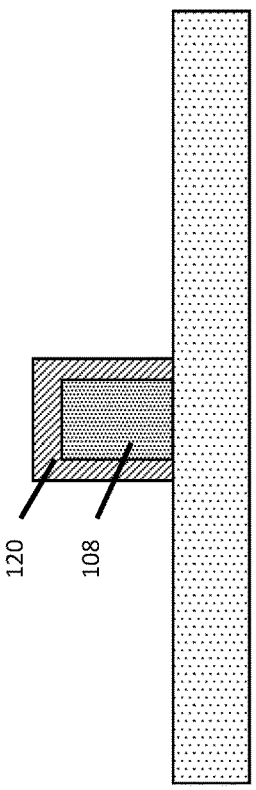

Referring to FIG. 23, illustrated are cross-sectional views 2300A and 2300B, and a side view 2302, of the next stage in the process flow. At this stage, a layer of 2D material 120 is formed in the air gap previously occupied by the sacrificial material 110, such that the 2D material 120 is in contact with the metal contacts 116 and the seed material 108. The 2D material can be any type of suitable TMD material, and may include $WS_2$, $WSe_2$, $MoS_2$, or $MoSe_2$, among others. The 2D material 120 can be formed, for example, by using selective epitaxial growth techniques. For example, initial growth can be started by applying high partial pressure of S or Se to seed the 2D material 120 on the contact metal 116, and then by adding additional amounts of the contact metal 116 to continuously grow the 2D material 120 to a desired size. In this way, the contact metal 116 can in part dictate the type of 2D material 120 that is grown. For example, W metal may be used for the contact metal 116 if $WS_2$ or $WSe_2$ will be used for the 2D material 120, or Mo metal may be used for the contact metal 116 if $MoS_2$ or $MoSe_2$ channels will be used for the 2D material 120. The 2D material 120 can be grown on the seed material and starting on the contact material 116, such that the 2D material 120 surrounds the seed material 108 along its length.

Figure 24:
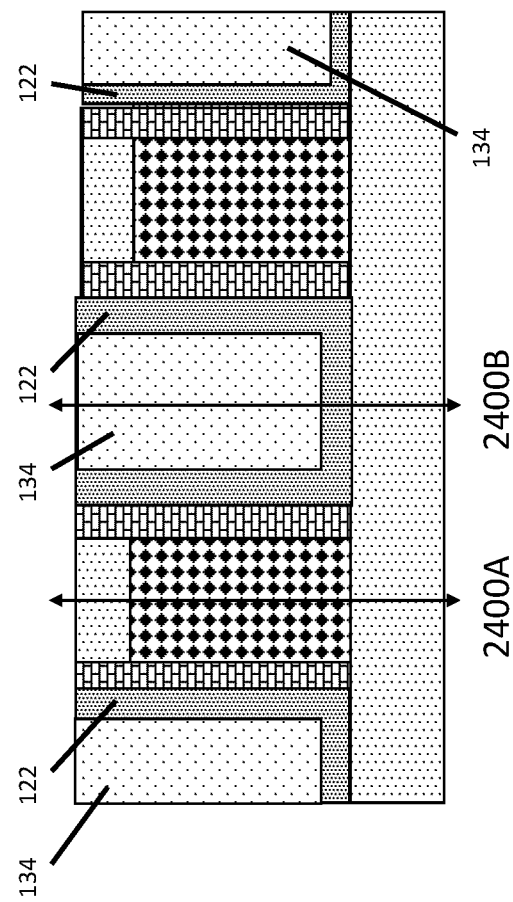
Figure 24:
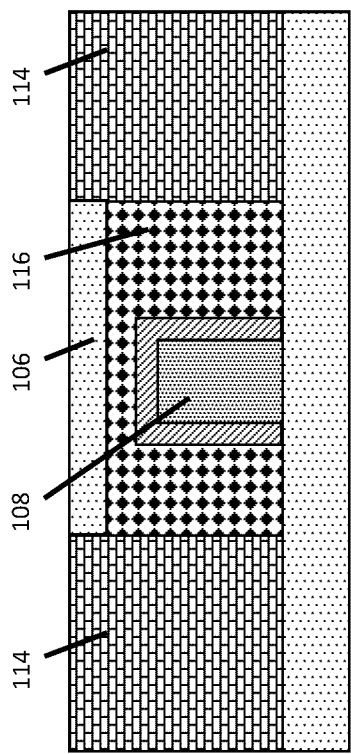
Figure 24:
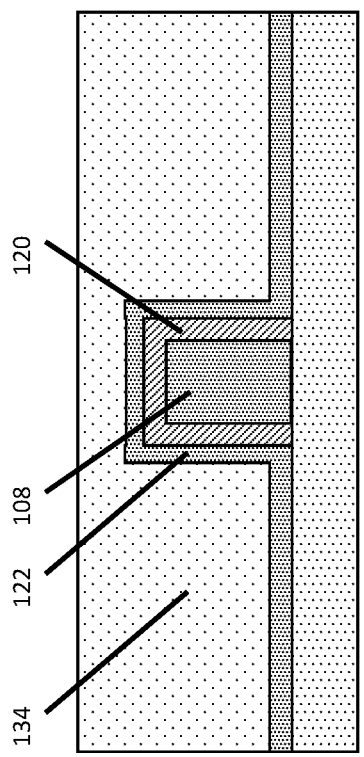

Referring to FIG. 24, illustrated are cross-sectional views 2400A and 2400B, and a side view 2402, of the next stage in the process flow. At this stage, a high-k dielectric material 122 is first deposited in the remaining gaps between the second dielectric materials 114, such that the high-k dielectric material 122 is in contact with and covers the 2D material 120. The high-k dielectric material 122 acts as a gate dielectric material for the channel, which is defined by the 2D material 120. The high-k dielectric material 122 can be any type of material with a relatively high dielectric constant, and may be deposited at a predetermined thickness to achieve a desired capacitance. In some implementations, the high-k dielectric material 122 can be selectively deposited or grown, such that the high-k dielectric is deposited only on the second dielectric material 114, the base layer of the dielectric material 106, and the 2D material 120. The high-k dielectric material 122 may be deposited using any suitable material deposition technique, including but not limited to ALD, CVD, PVD, or PECVD, among others. Once the high-k dielectric material 122 has been formed on the 2D material, the remaining gap can be filled with a gate metal 134. The gate metal 134 can be any type of metal capable of operating as a gate electrode (e.g., platinum, gold, silver, copper, etc.).

Although not shown here for the sake of simplicity, any of the gate metals 134, the metal contacts 116, or the cap materials 118 can be electrically connected with one another by patterning appropriate traces, vias, or other connections to form desired circuits. Each of the metal contacts 116 can behave as a source or a drain for one or more transistor structures formed using this process flow. Any type and number of connections may be formed between any types of layers, for example, connections between gate structures to gate structures of other transistor structures, as well as connections between the metal contacts 116 or cap materials 118 to other conductive layers of other transistors. Similarly, it should be understood that the techniques described herein do not require a base layer of silicon, and therefore multiple stacks of material fabricated using the techniques described herein may be formed on top of one another to create large, 3D stacks of transistor structures. Stacks of N-high transistor structures can be manufactured using the techniques described herein. Likewise, any number of parallel fins of the seed material 108 and the sacrificial material may be formed on the base layer of the dielectric material 106, further increasing possible transistor density.

Figure 25:
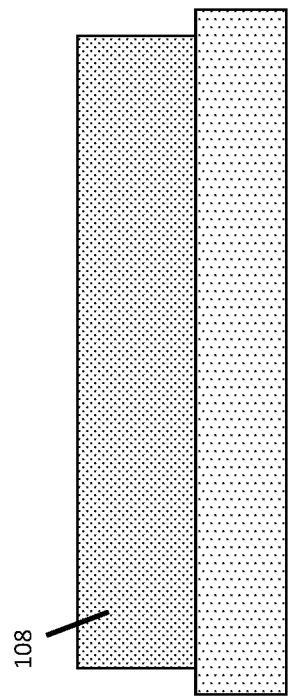
FIGS. 25-33 show various views of a fourth process flow to integrate 2D materials into a FinFET device, according to an embodiment.
Figure 25:
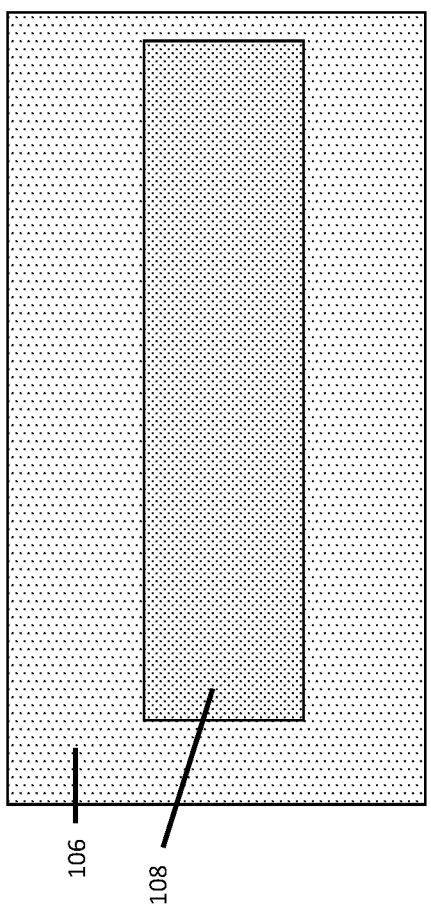
Figure 25:
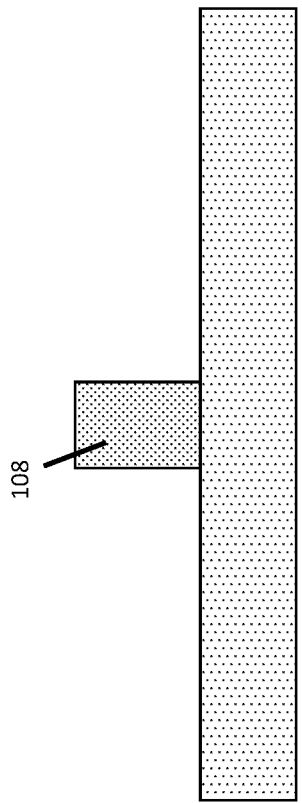

FIGS. 25-33 show various views of a fourth process flow to integrate 2D materials into a FinFET device, according to an embodiment. Referring to FIG. 25, illustrated is a cross-sectional view 2502 facing the front of the fin of a FinFET configuration, second side view 2500 that shows the side of the fin of the FinFET configuration, and a top view 2504 that shows the top of the FinFET configuration. At the start of the process flow, a first layer of dielectric material 106 is formed as a base material (sometimes referred to as a base layer), and a layer of seed material 108 is formed on top of the layer of dielectric material 106. The dielectric material 106 can be any type of material that can bond with, or otherwise be coupled to, a layer of the seed material 108. The dielectric material 106 can have a relatively high dielectric constant and behave as an insulator.

The seed material 108 can be patterned and deposited (or grown) using any suitable material deposition technique, such that the seed material 108 forms a "fin," or a rectangular structure with a majority of its length formed along a first axis. The seed material 108 can be patterned to have a predetermined width, height, and length. As shown, the length of the seed material 108 is substantially larger than its width or height, and is formed along a first axis. The seed material 108 can be a single crystal semiconductor material (e.g., Si, SiGe, Ge, any III-V or II-VI material, etc.), or any type of insulator material (e.g., oxides, other insulators, etc.). The seed material 108 can be bonded to or transferred onto the first layer of the dielectric material 106. Some further examples of the seed material 108 include hexagonal boron nitride, diamond, or epitaxial dielectric like LaAlO$_x$ or STO, among others.

Figure 26:
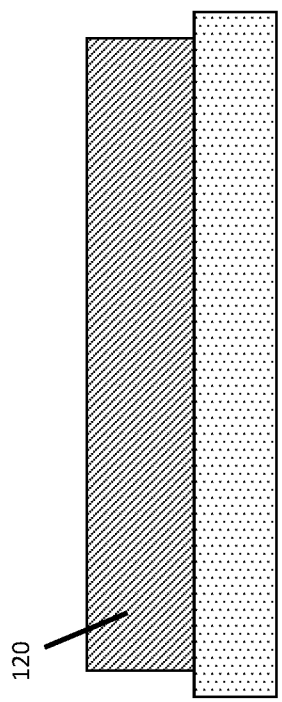
Figure 26:
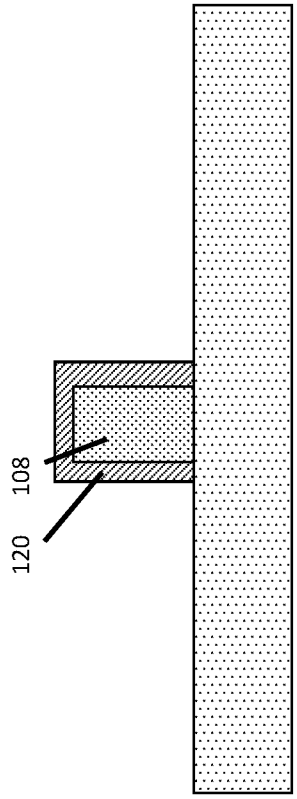
Figure 26:
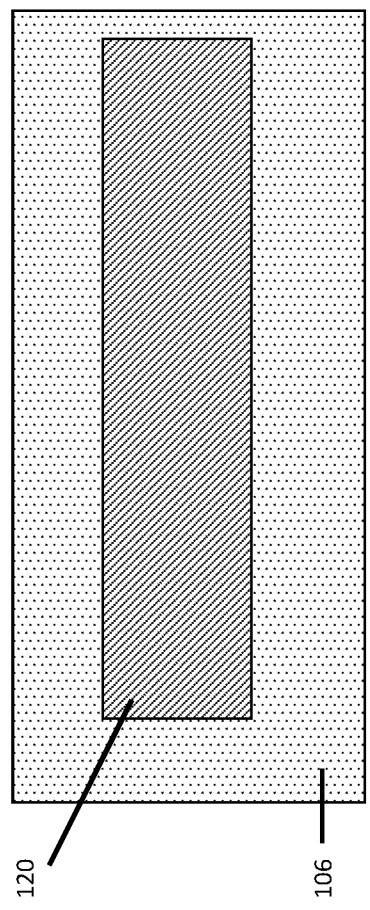

Referring to FIG. 26, illustrated is a cross-sectional view 2602, a side view 2600, and a top view 2604, which show the next stage in the process flow. At this stage in the process flow, a layer of a 2D material 120 is formed on top of the seed material 108, such that the 2D material 120 surrounds the seed material 108 and contacts the base layer of the dielectric material 106. The layer of the first 2D material 120 can be grown epitaxially or deposited (e.g., using processes such as ALD, CVD, PVD, or PECVD, etc.), or otherwise formed on the fin of seed material 108. The 2D material can be any type of suitable TMD material, and may include $WS_2$, $WSe_2$, $MoS_2$, or $MoSe_2$, among others. In some implementations, the type of the seed material 108 may be chosen based on the desired type of the 2D material 120. For example, W metal may be used for the seed material 108 if $WS_2$ or $WSe_2$ is desired for the 2D material 120 (e.g., the transistor channels), or Mo metal may be used for the seed material 108 if $MoS_2$ or $MoSe_2$ channels are desired.

Figure 27:
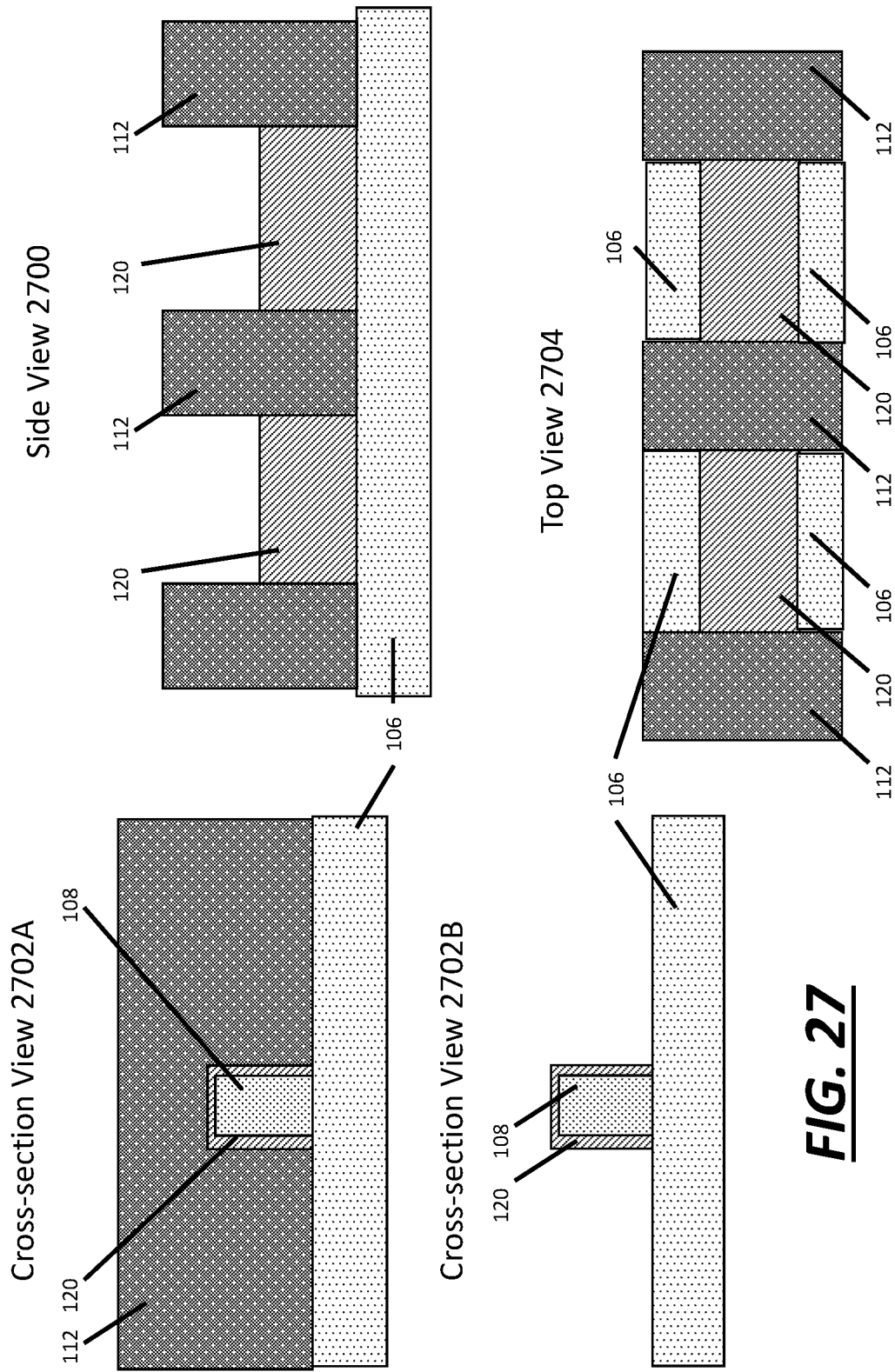

Referring to FIG. 27, illustrated are cross-sectional views 2702A and 2702B, a side view 2700, and a top view 2704, which show the next stage in the process flow. At this stage, a sacrificial material 112 (or other similar, suitable material) can be deposited to form a "dummy gate," or a region of material that occupies a volume that will layer be replaced with a gate (including high-k dielectric materials). The sacrificial material 112 can first be deposited using any suitable material deposition technique, including ALD, CVD, PVD, or PECVD, among others. The sacrificial material 112 can be patterned using a suitable mask to define one or more openings that expose portions of the sacrificial material 110 and the dielectric material 106. In some implementations, a layer of the sacrificial material 112 can be formed, and then etched to form the openings. In some implementations, multiple types of material may be used in place of the sacrificial material 112 to leverage AB selectively to form different types of gates (e.g., for N-type or P-type transistors). For example, a region that will have a first type of gate may be formed with the sacrificial material 112, while a region that will have a different type of gate may be filled with a different type of material.

Figure 28:
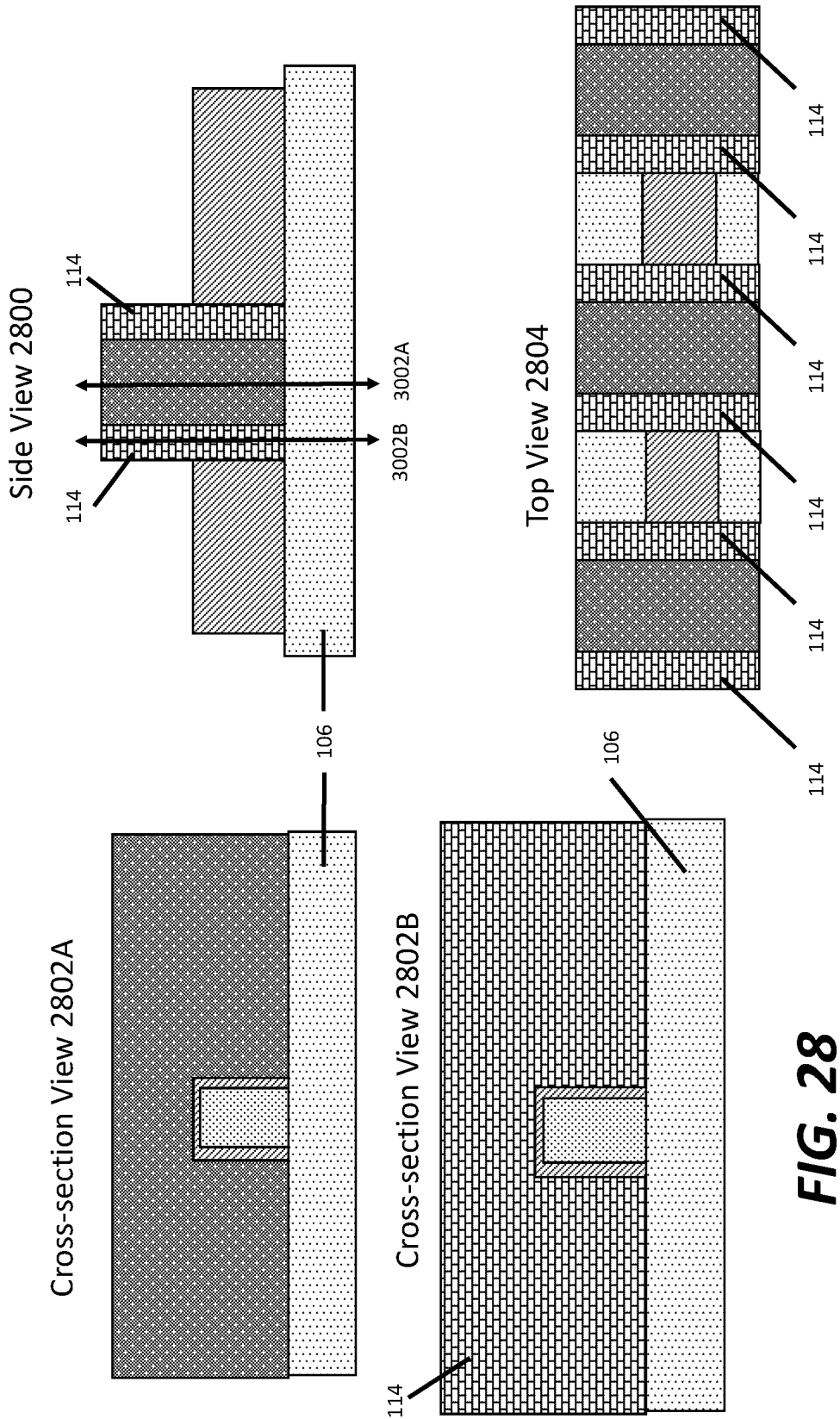

Referring to FIG. 28, illustrated are cross-sectional views 2802A and 2802B, a side view 2800, and a top view 2804, which show the next stage in the process flow. At this stage, a second dielectric material 114 is formed in the openings between the structures of the sacrificial material 112, which contacts a portion of the both the 2D material 120 and the dielectric material 108. The second dielectric material 114 can be formed using any suitable material deposition technique, including ALD, CVD, PVD, or PECVD, among others. In some implementations, the second dielectric material 114 can be deposited to fill the openings defined between the sacrificial material 112, and subsequently etched using a suitable etching technique to expose the sacrificial material 110 and the dielectric material 106, as shown. When describing this process flow, certain sacrificial material 112 structures (and corresponding portions of the second dielectric material 114) may be omitted from the process flow for visual simplicity, however, it should be understood that any number of polysilicon material (e.g., or another sacrificial material) structures (and corresponding dielectric material 114) can be formed, as will be shown in further figures in this process flow.

Figure 29:
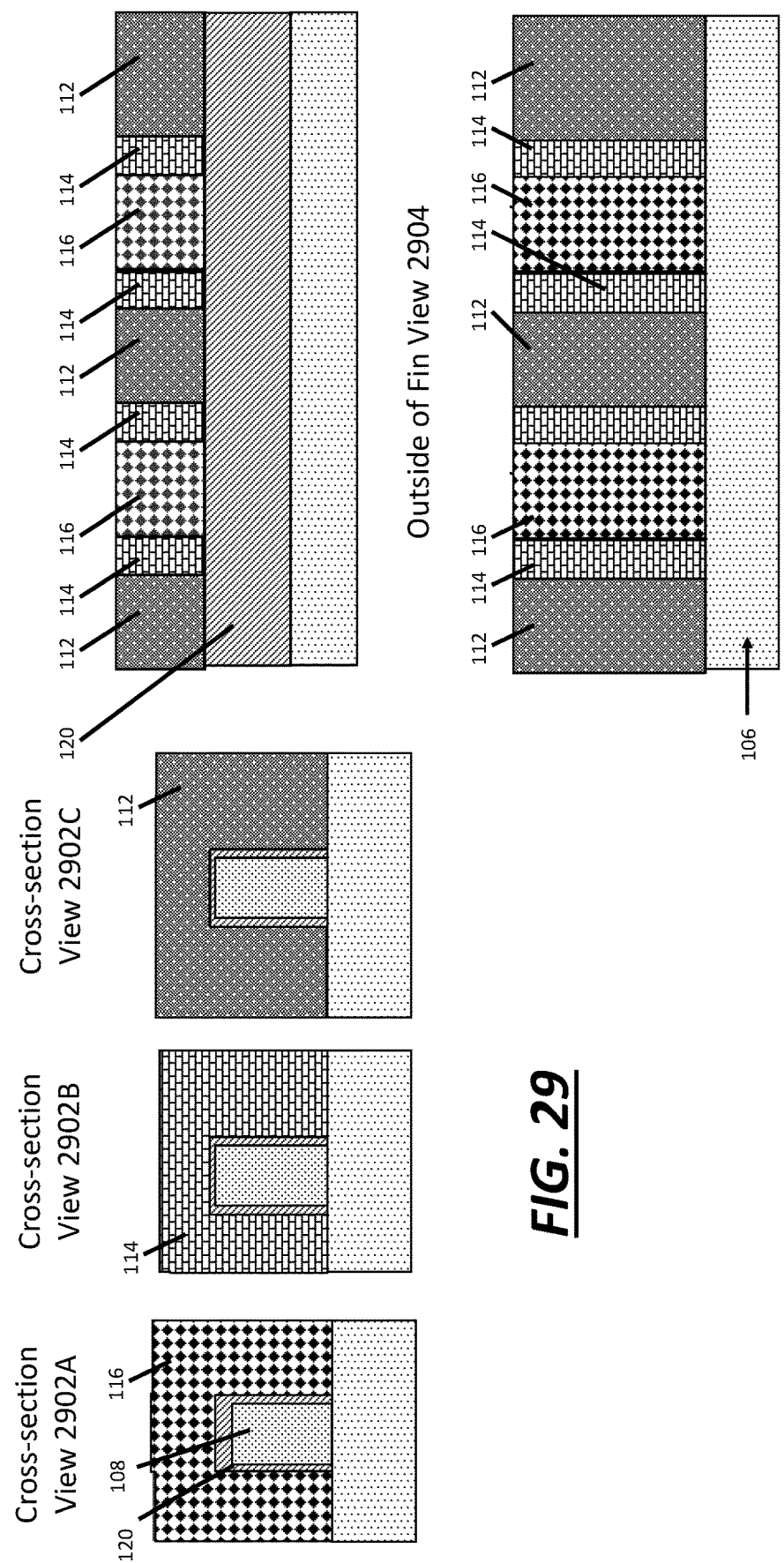
Figure 30:
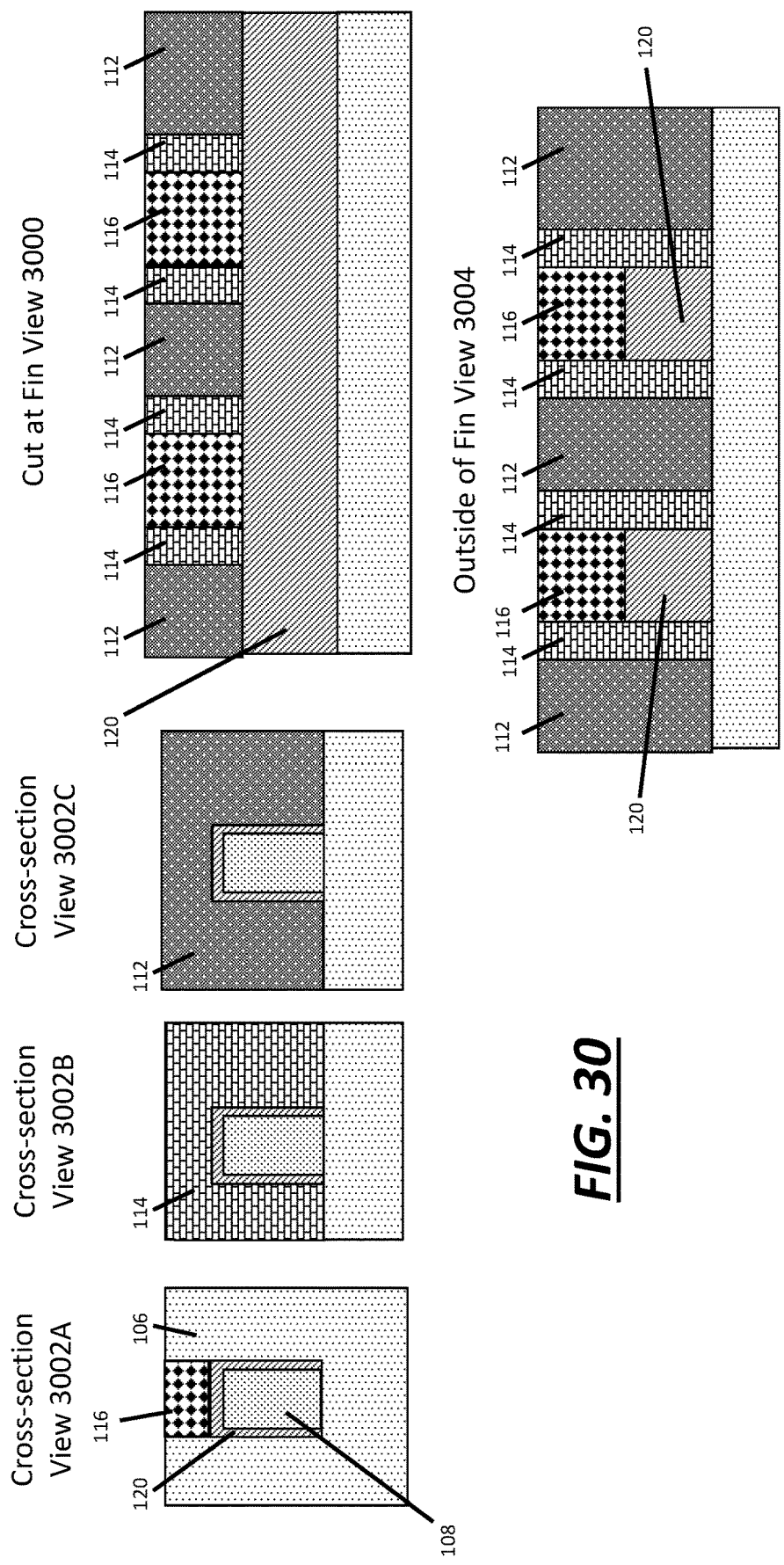

FIGS. 29 and 30 show alternative approaches to forming a contact metal following the process steps described through FIG. 28. Referring to FIG. 29, illustrated are cross-sectional views 2902A, 2902B and 2902C, a side view 2900, and an outside of Fin side view 2904, which show the next stage in the process flow. As shown, the contact metal 116 is deposited or otherwise formed in the opening between the sacrificial material 112 structures. The contact metal 116 may be formed after forming sidewalls in the opening between sacrificial material 112 and dielectric material 114 structures using the first dielectric material 106 (not shown). To form the sidewalls, the first dielectric material 106 can be deposited to fill the opening using any suitable material deposition technique, and CMP process can be performed. Then, a contact opening in the dielectric material 106 can be formed by masking and etching the dielectric 106 using any suitable etching technique. The newly formed contact opening can then be deposit-filled with the contact metal 116 using any suitable material deposition technique. Once deposited, the contact metal 116 will be in contact with the 2D material 120. In the implementation of the process flow in FIG. 29, the contact metal 116 surrounds the top and sides of the 2D material 120, as shown in the cross-sectional view 2902. After depositing the contact metal 116, a CMP process may be performed. The contact metal 116 can be any type of metal, and may be surrounded by the dielectric material 106 and the second dielectric material 114. The contact metal 116 can be any suitable type of metal, including gold, platinum, silver, molybdenum, tungsten, or copper, among others.

Referring to FIG. 30, illustrated is are cross-sectional views 3002A, 3002B, and 3002C, a cut at Fin view 3000, and an outside of Fin side view 3004, of an alternative process flow stage to that described in connection with FIG. 29, following the stage in the process flow described in connection with FIG. 28. The steps in the process flow are substantially the same as those described in connection with FIG. 29, with the difference being that the dielectric material 106 is deposited to contact the sides of the 2D material 120, as shown in the cross-sectional view 3002A. As a result, rather than having the metal contact metal 116 surround both the top and sides of the 2D material 120, the metal contact metal 116 is present only on the top of the 2D material 120.

Figure 31:
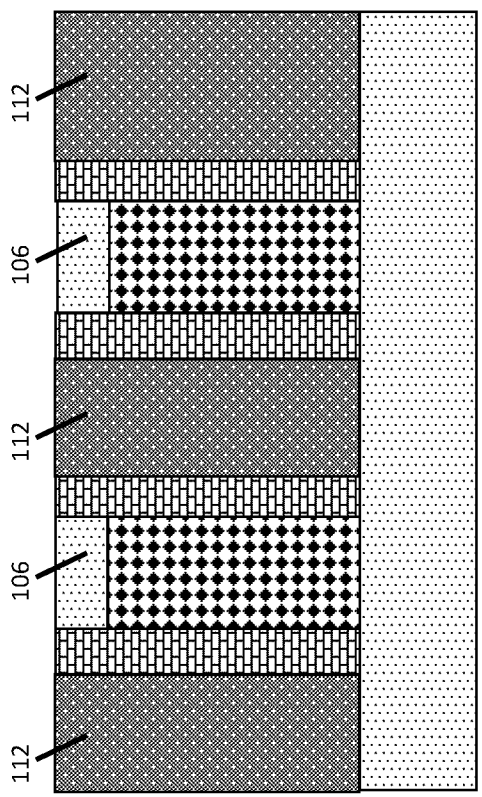
Figure 31:
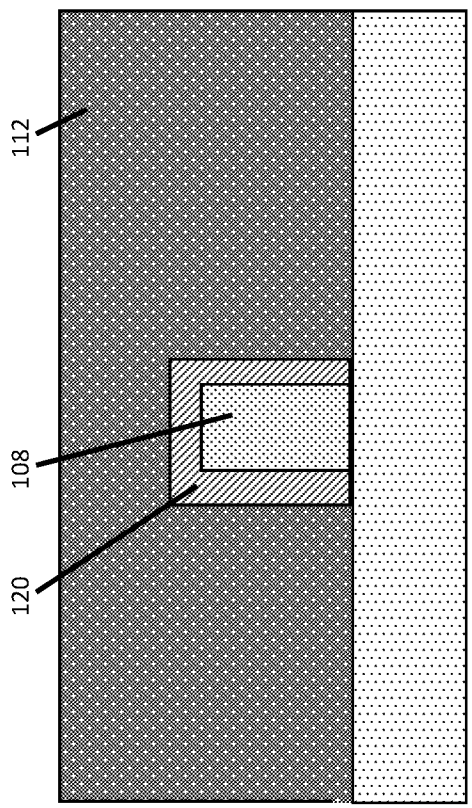

Referring to FIG. 31, illustrated is a cross-sectional view 3102 and a side view 3100 of the next stage in the process flow, which may follow the process steps described in connection with either FIG. 29 or FIG. 30. At this stage in the process flow, the contact metal 116 can be partially etched to create a recessed portion at the top of the device. The recessed portion may be bordered by the dielectric material 106 (not shown) and the second dielectric material 114. The portion of contact metal 116 can be etched or otherwise removed using any suitable etching technique. After etching to recess a portion of the contact metal 116, the dielectric material 106 can be deposited in the recessed portion. After depositing the dielectric material 106, a CMP process may be performed.

Figure 32:
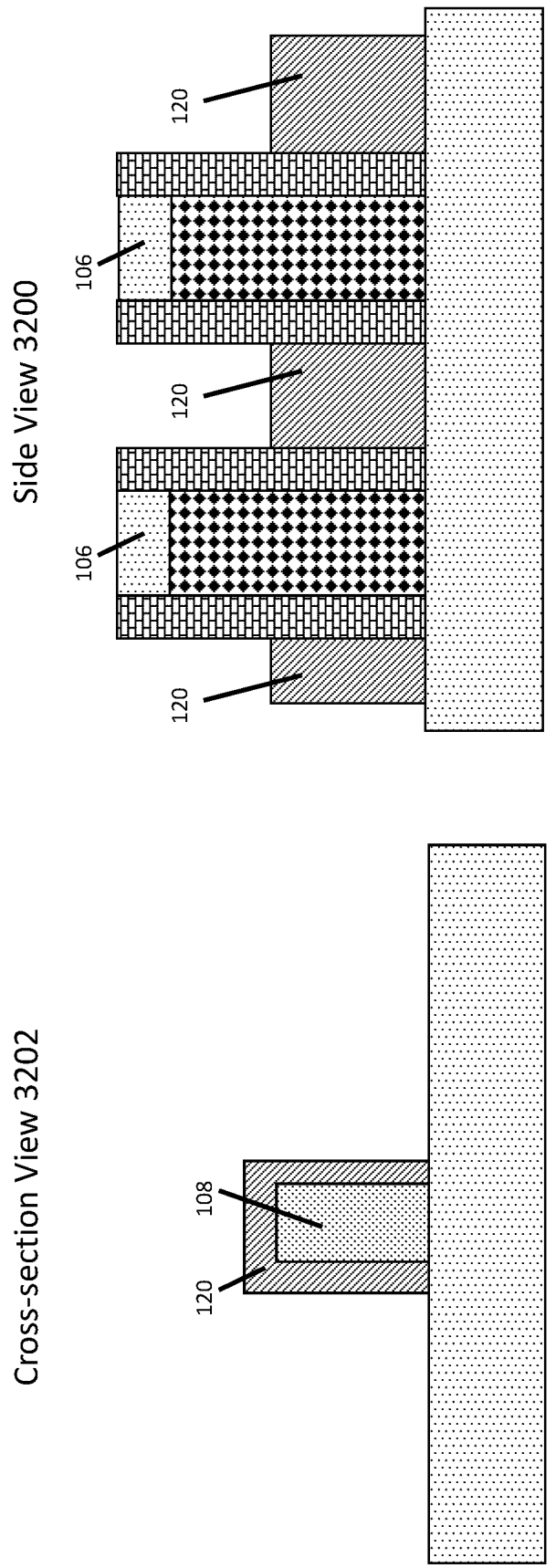

Referring to FIG. 32, illustrated is a cross-sectional view 3202 and a side view 3200 of the next stage in the process flow. At this stage in the process flow, the sacrificial material 112 can be removed to expose a portions of the 2D material 120, as well as a portion of the base layer of the dielectric material 106 and the second dielectric material 114. The sacrificial material 112 can be removed using any suitable etching technique, including but not limited to dry etching, wet etching, or plasma etching techniques. As shown, this creates openings between the portions of the second dielectric material 114 that surround the metal contacts 116. These openings will be filled with gate materials in further steps of this process flow.

Figure 33:
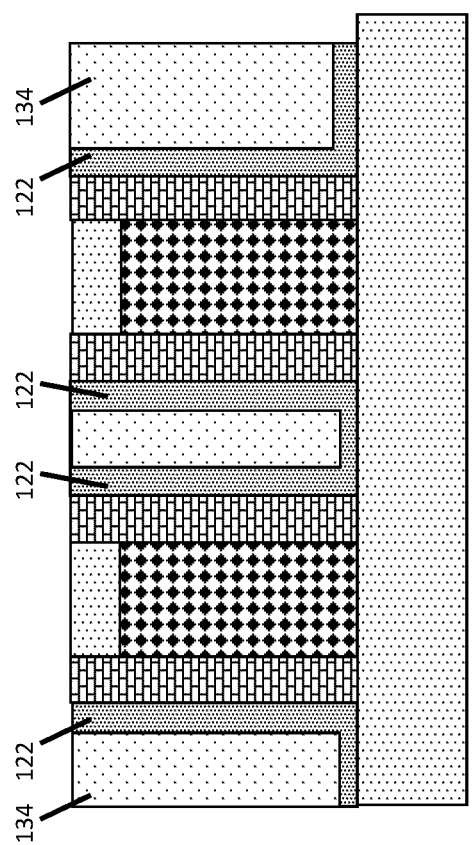
Figure 33:
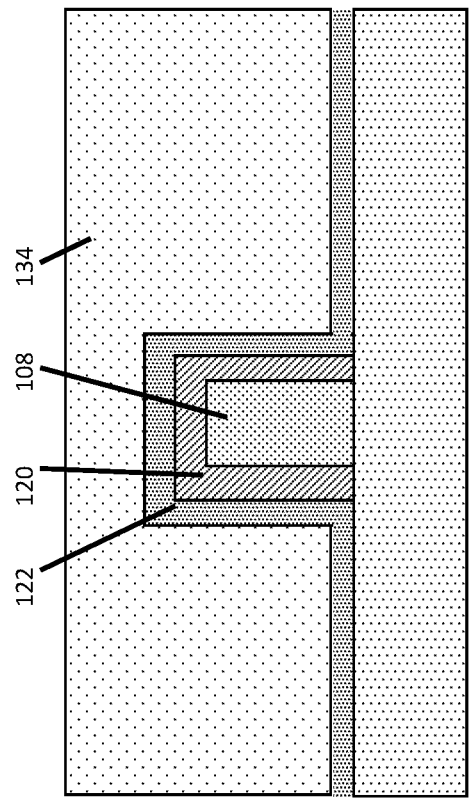

Referring to FIG. 33, illustrated is a cross-sectional view 3302 and a side view 3300 of the next stage in the process flow. At this stage, a high-k dielectric material 122 is first deposited in the openings between the second dielectric materials 114, such that the high-k dielectric material 122 is in contact with, and covers, the 2D material 120. The high-k dielectric material 122 acts as a gate dielectric material for the channel, which is defined by the 2D material 120. The high-k dielectric material 122 can be any type of material with a relatively high dielectric constant, and may be deposited at a predetermined thickness to achieve a desired capacitance. In some implementations, the high-k dielectric material 122 can be selectively deposited or grown, such that the high-k dielectric is deposited only on the second dielectric material 114, the base layer of the dielectric material 106, and the 2D material 120. The high-k dielectric material 122 may be deposited using any suitable material deposition technique, including but not limited to ALD, CVD, PVD, or PECVD, among others. Once the high-k dielectric material 122 has been formed on the 2D material, the remaining gap can be filled with a gate metal 134. The gate metal can be any type of metal capable of operating as a gate electrode (e.g., platinum, gold, silver, copper, etc.).

Although not shown here for the sake of simplicity, any of the gate metals 134, the metal contacts 116, or the cap materials 118 can be electrically connected with one another by patterning appropriate traces, vias, or other connections to form desired circuits. Each of the metal contacts 116 can behave as a source or a drain for one or more transistor structures formed using this process flow. Any type and number of connections may be formed between any types of layers, for example, connections between gate structures to gate structures of other transistor structures, as well as connections between the metal contacts 116 or cap materials 118 to other conductive layers of other transistors. Similarly, it should be understood that the techniques described herein do not require a base layer of silicon, and therefore multiple stacks of material fabricated using the techniques described herein may be formed on top of one another to create large, 3D stacks of transistor structures. Stacks of N-high transistor structures can be manufactured using the techniques described herein. Likewise, any number of parallel Fins of the seed material 108 and the sacrificial material may be formed on the base layer of the dielectric material 106, further increasing possible transistor density.

Figure 34:
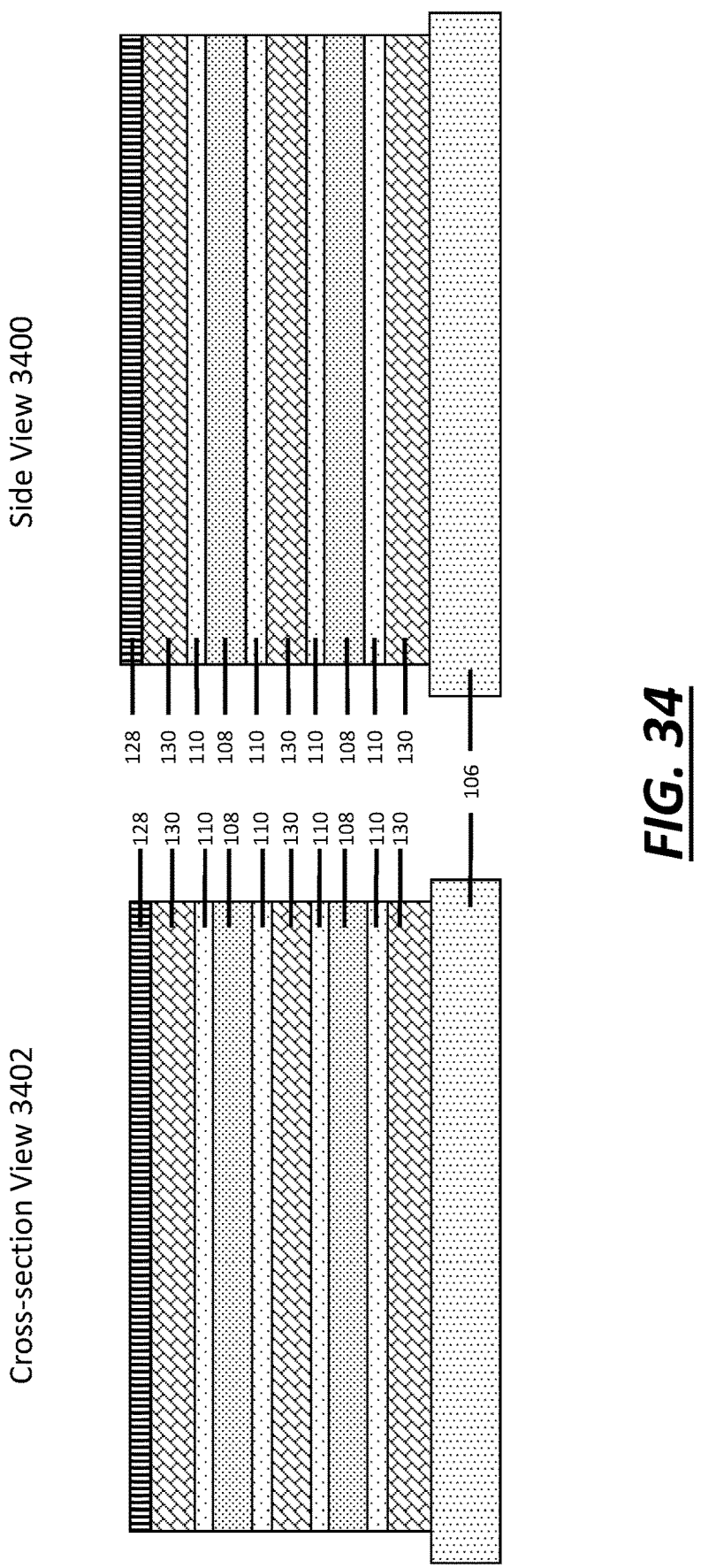
FIG. 34-42 show various views of a fifth process flow to integrate 2D materials into a vertically stacked device, according to an embodiment.

FIG. 34-42 show various views of a fifth process flow to integrate 2D materials into a vertically stacked device, according to an embodiment. Referring to FIG. 34, illustrated is a cross-sectional view 3402 and a side view 3400 of the first stage in the fifth process flow. At this stage in the process flow, a stack of layers is created. The stack of layers is constructed on a first layer of dielectric material 106 formed as a base material. The stack of layers includes a layer of the first sacrificial material 110 formed on a layer of a second sacrificial material 130, which is formed on the base layer of the dielectric 106. The dielectric material 106 can have a relatively high dielectric constant and behave as an insulator. The layers of the first sacrificial material 110 and the second sacrificial material 130 can be grown, deposited (e.g., using processes such as ALD, CVD, PVD, or PECVD, etc.), on top of the base layer of dielectric 106. A layer of a seed material 108 is then formed on the sacrificial material 110.

The seed material 108 can be a single crystal semiconductor material (e.g., Si, SiGe, Ge, any III-V or II-VI material, etc.), or any type of insulator material (e.g., oxides, other insulators, etc.). The seed material 108 can be bonded to or transferred onto the first layer of the sacrificial material 110. Some further examples of the seed material 108 include hexagonal boron nitride, diamond, or epitaxial dielectric like LaAlO$_x$ or STO, among others. Another layer of the sacrificial material 110 can then be formed on the seed layer 108 using similar processes. Multiple stacks of layers can be formed on top of each other to create multiple vertically stacked devices. As shown, two stacks of layers are constructed on top of one another. After a desired number of layers have been using the aforementioned techniques, a hardmask 128 can be formed at the top of the stack. The hardmask 128 can be any type of material that is resistant to certain types of etching.

Figure 35:
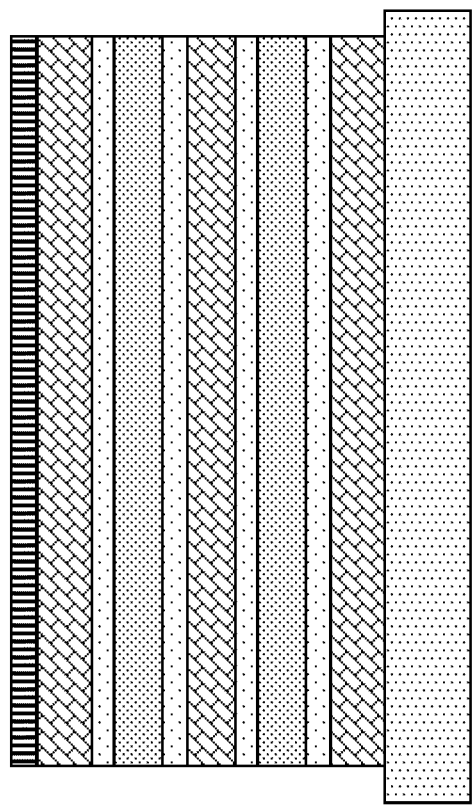
Figure 35:
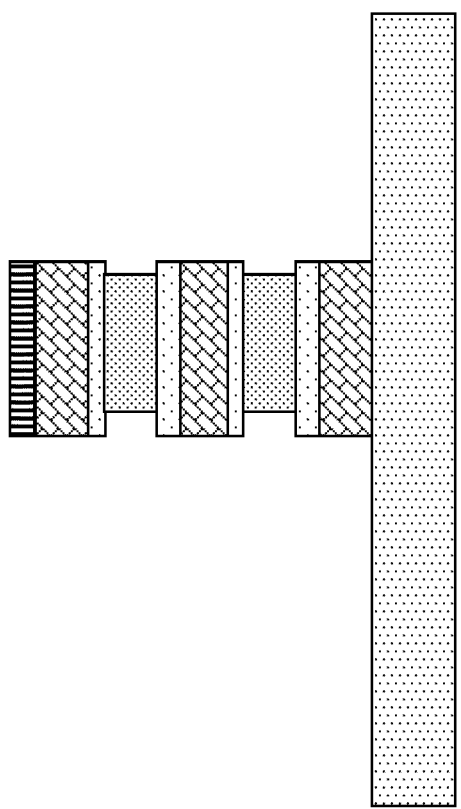

Referring to FIG. 35, illustrated is a cross-sectional view 3502 and a side view 3500 of the next stage in the process flow. At this stage, the stage of layers formed on the base layer of the dielectric 106 can be etched to a desired width, as shown in the cross-sectional view 3502. The width can be chosen based on desired electrical characteristics of the device. Any suitable etching or material removal technique can be used, including but not limited to dry etching, wet etching, or plasma etching techniques, among others. After etching the stack of layers, the layers of the seed material 108 can be recessed partially to create recessed openings, as shown in the cross-sectional view 3502. The recessed openings can be formed using any suitable etching or removal technique.

Figure 36:
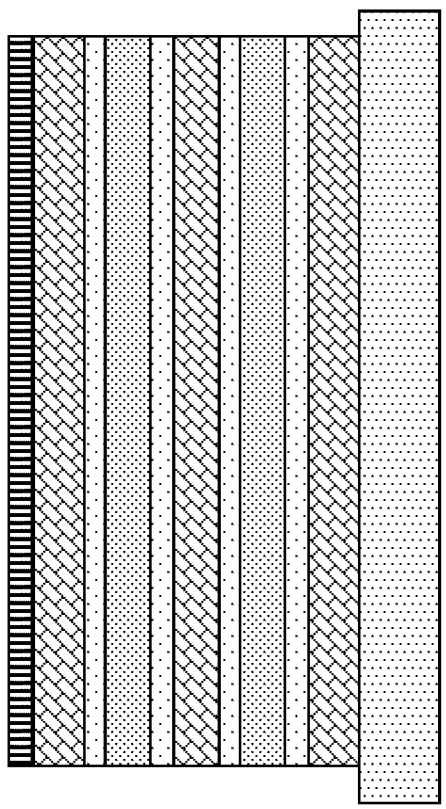
Figure 36:
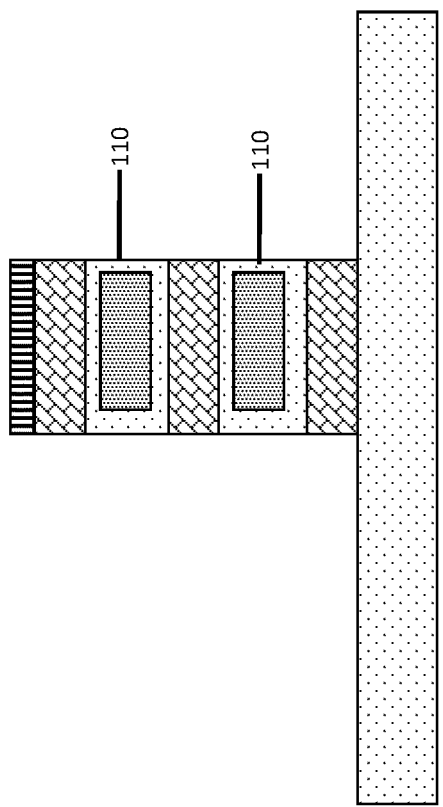

Referring to FIG. 36, illustrated is a cross-sectional view 3602 and a side view 3600 of the next stage in the process flow. At this stage, the recessed portions formed in the previous step can be filled with the sacrificial material 110. To fill the recesses, the sacrificial material 110 can first be deposited over the sides of the stack using any suitable material deposition technique, including but not limited to including ALD, CVD, PVD, or PECVD. Then, a selective etching process can be performed to remove any sacrificial material 110 present beyond the recessed regions. Any suitable etching technique can be used, including but not limited to dry etching, wet etching, or plasma etching techniques, among others. After the etching process, the sacrificial material 110 can surround the layers of the seed material 108 along their length, as shown in the cross-sectional view 3602.

Figure 37:
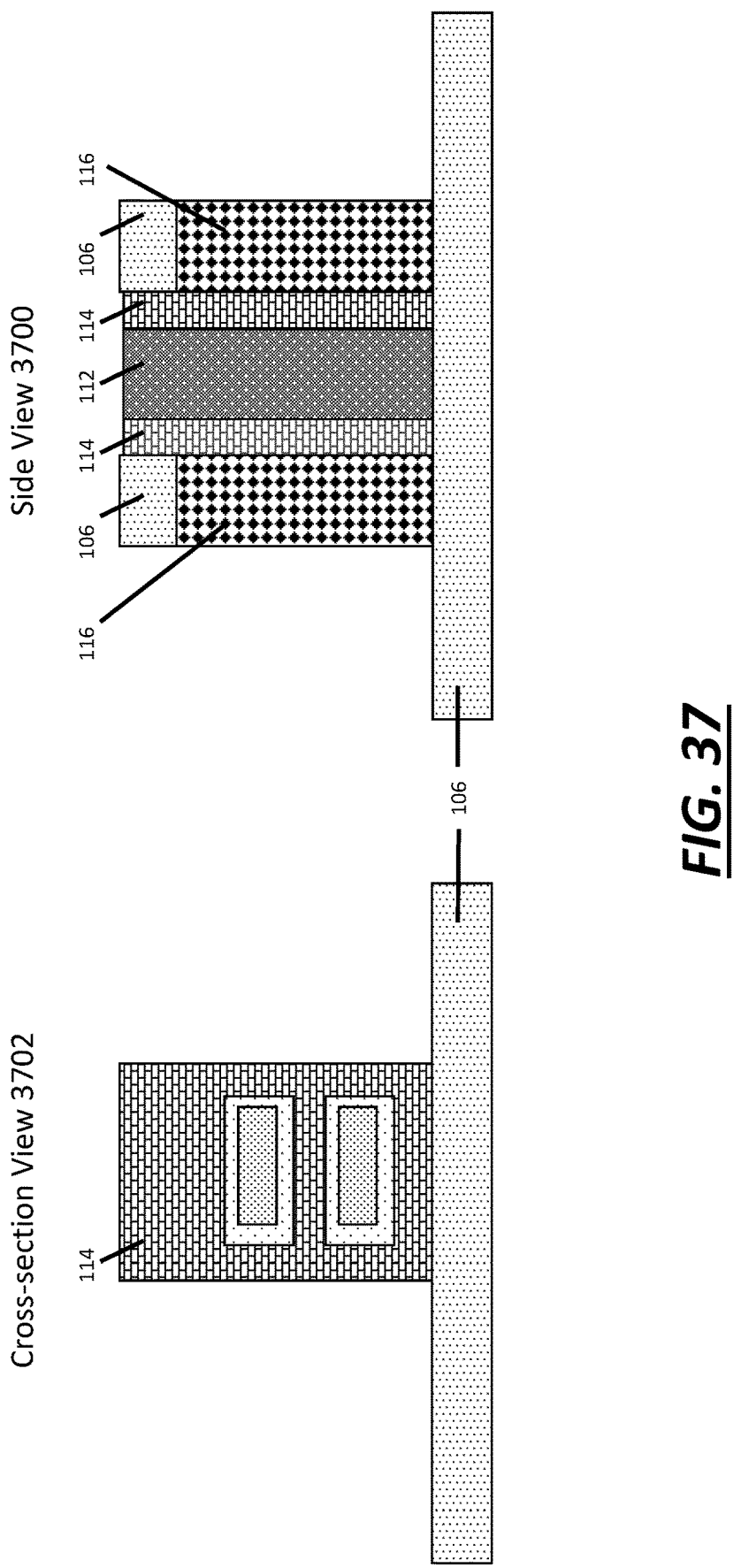

Referring to FIG. 37, illustrated is a cross-sectional view 3702 and a side view 3700 of the next stage in the process flow. At this stage, the sacrificial material 130 is removed and replaced with the contact metal 116, the dielectric material 114, and the sacrificial material 112. To do so, an inner portion of the sacrificial material 130 (e.g., the inner portion defined by the outer edges of the dielectric material 114 in the side view 3700, across all three (or more, if present) layers of the sacrificial material 130) can first be removed using any suitable selective etching technique. This can include masking outer portions of the sacrificial material 130 such that they are not removed with the inner portions of the sacrificial material 130. This forms an opening in the inner portion of the layers of the device, with both the layers of the seed materials 108 and the sacrificial material 110 intact.

The second dielectric material 114 can then be formed in the opening, such that it fills the etched inner portion and surrounds the inner portion of the sacrificial material 110. The second dielectric material 114 can be formed using any suitable material deposition technique, including ALD, CVD, PVD, or PECVD, among others. Then, the dielectric material 114 can be etched to form the two inner spacers shown in the side view 3700, using a suitable etching technique. This forms a second opening at the center of the device, which can be subsequently deposit filled with the sacrificial material 112. In some implementations, the sacrificial material 112 can be deposited prior to the formation of the inner spacers of the dielectric material 114. After forming the sacrificial material 112 and the dielectric material 114, the metal contacts 116 can be formed. To form the metal contacts 116, any remaining portions of the outer sacrificial material 130 can be removed using any suitable selective etching technique, exposing portions of the sacrificial material 110, which is secured in place by the dielectric materials 114 and the sacrificial material 112.

Then, the contact metal 116 can be deposit filled to surround the sacrificial material 110, and be in contact with the dielectric materials 114 as shown in the cross-sectional view 3702. The contact metal 116 can be any type of metal including gold, platinum, silver, molybdenum, tungsten, or copper, among others. In some implementations, the contact metal 116 can correspond to the type of channel used in the transistors formed in the process flow. For example, W metal may be used for the contact metal 116 if $WS_2$ or $WSe_2$ transistor channels will be used, or Mo metal may be used for the contact metal 116 if $MoS_2$ or $MoSe_2$ channels will be used. The contact metal 116 can be the seed for selective seeded layer growth of TMD materials (e.g., the 2D materials 120), which serve as the channel for the transistor devices fabricated in this process flow. The contact metal 116 can then be partially etched to create a recessed portion at the top of the device. The portion of contact metal 116 can be etched or otherwise removed using any suitable etching technique. After etching to recess a portion of the contact metal 116, the dielectric material 106 can be deposited in the recessed portion. After depositing the dielectric material 106, a CMP process may be performed.

Figure 38:
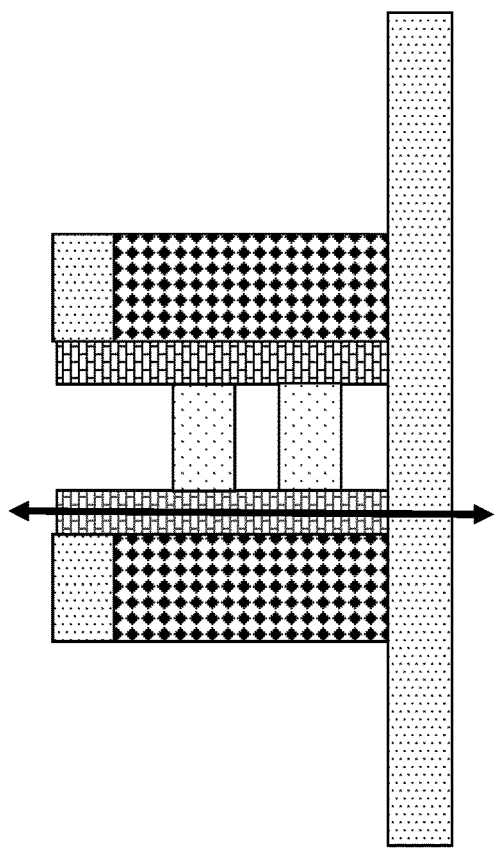
Figure 38:
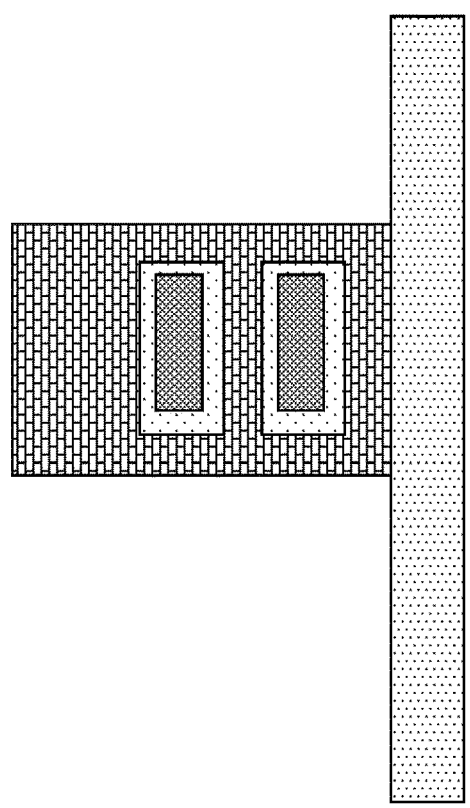

Referring to FIG. 38, illustrated is a cross-sectional view 3802 and a side view 3800 of the next stage in the process flow. At this stage in the process flow, the sacrificial material 112 can be removed to expose a portions of the sacrificial material 110, as well as a portion of the base layer of the dielectric material 106 and the second dielectric material 114. The sacrificial material 112 can be removed using any suitable etching technique, including but not limited to dry etching, wet etching, or plasma etching techniques. As shown in the side view 3800, this creates openings between the layers of the sacrificial material 110, which encapsulate the seed material 108. However, the sacrificial material 110 and the seed material 108 remain suspended by the second dielectric material 114 and the metal contacts 116.

Figure 39:
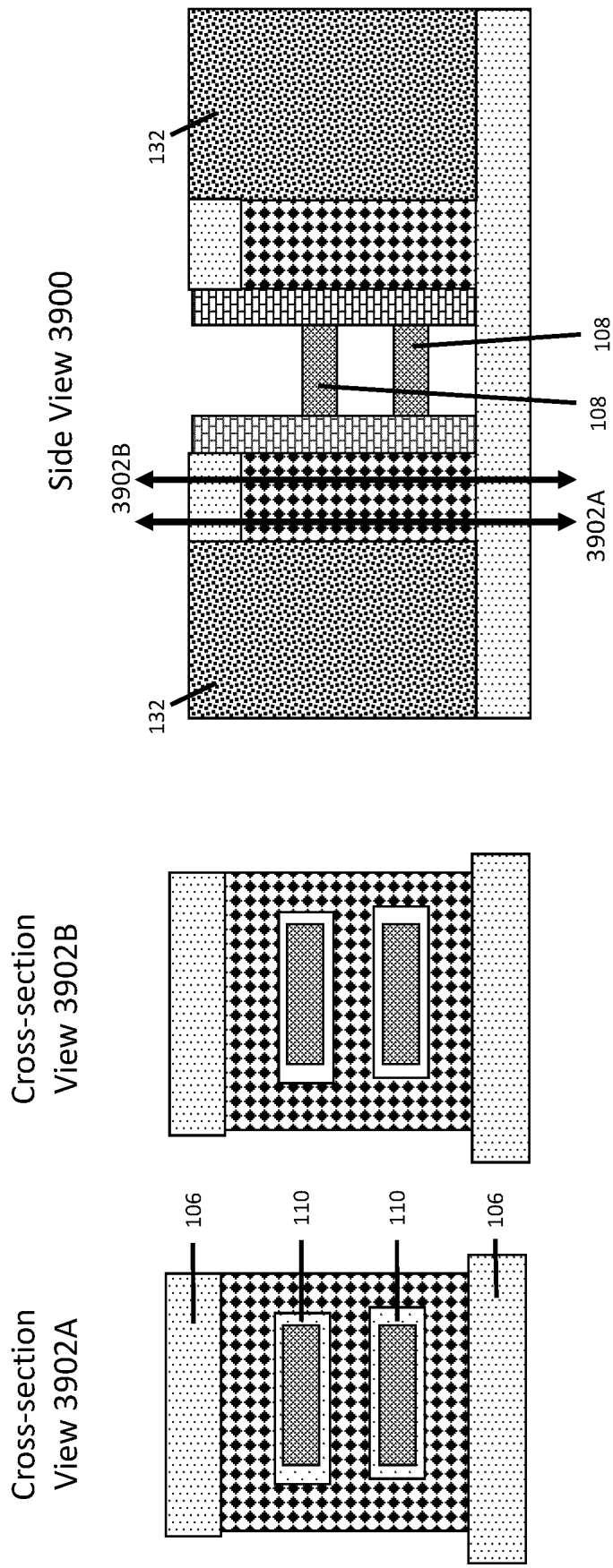

Referring to FIG. 39, illustrated are cross-sectional views 3902A and 3902B, and a side view 3900, of the next stage in the process flow. At this stage in the process flow, a third dielectric material 132 is deposited to contact the metal contacts 116, the seed material 108, and the sacrificial material 110. The third dielectric material 132 can be any type of dielectric material, including, for example, oxide materials. The third dielectric material 132 can prevent the removal of a portion of the sacrificial material 110 in further etching steps. Once the third dielectric material 132 has been formed on either side of the device, a portion of the sacrificial material 110 can be removed using a suitable etching or material removal technique, to expose a portion of the seed material 108 in the opening between the structures of the second dielectric materials 114. As shown in the cross-sectional views 3902A and 3902B, the sacrificial material 110 can be removed between the seed material and the second dielectric material 114. However, as shown in the cross-sectional view 3902A, a portion of the sacrificial material 110 remains to secure the seed material 108 in place between the metal contacts 116. Nonetheless, a small gap between the seed material 108 and the metal contacts 116 is created by etching the sacrificial material 110, such that 2D material can be grown between the metal contacts 116 and the seed material 108.

Figure 40:
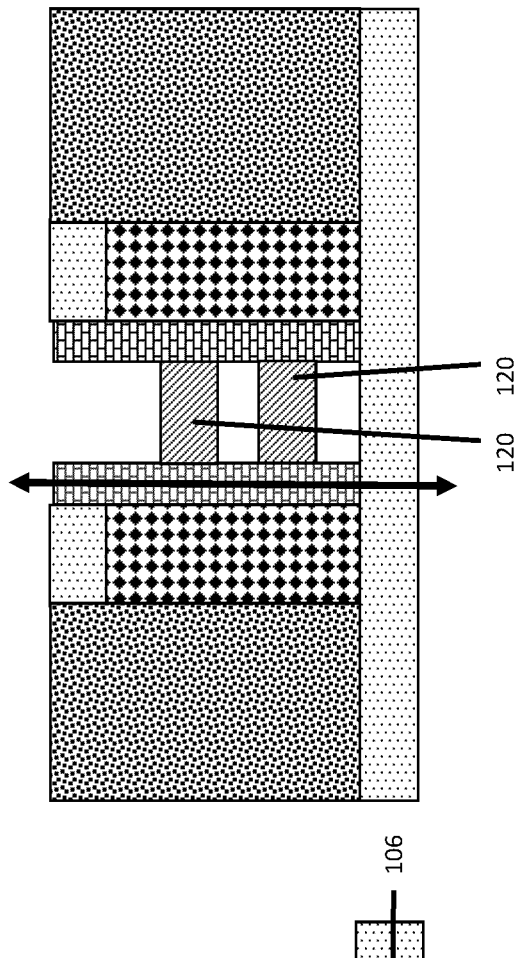
Figure 40:
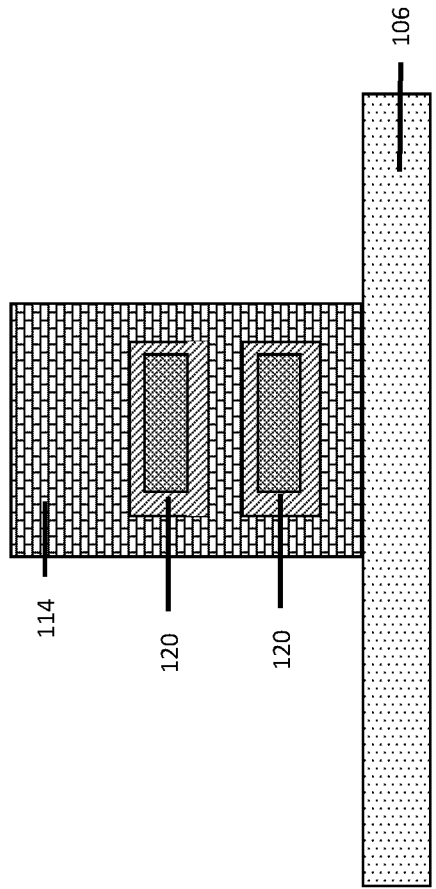

Referring to FIG. 40, illustrated is a cross-sectional view 4002 and a side view 4000 of the next stage in the process flow. At this stage, the 2D material 120 can be formed to fill the gap between the metal contacts 116 and the seed material 108, and between the second dielectric materials 114 and the seed material 108. The 2D material 120 can be any type of suitable TMD material, and may include $WS_2$, $WSe_2$, $MoS_2$, or $MoSe_2$, among others. The 2D material 120 can be formed, for example, by using selective epitaxial growth techniques. For example, initial growth can be started by applying high partial pressure of S or Se to seed the 2D material 120 on the metal contact 116, and then by adding additional amounts of the contact metal 116 to continuously grow the 2D material 120 to a desired size. In this way, the contact metal 116 can in part dictate the type of 2D material 120 that is grown. For example, W metal may be used for the contact metal 116 if $WS_2$ or $WSe_2$ will be used for the 2D material 120, or Mo metal may be used for the contact metal 116 if $MoS_2$ or $MoSe_2$ channels will be used for the 2D material 120. The 2D material 120 can be grown on the seed material and starting on the contact metal 116, such that the 2D material 120 surrounds the seed material 108 along its length, as shown in the side view 4000.

Figure 41:
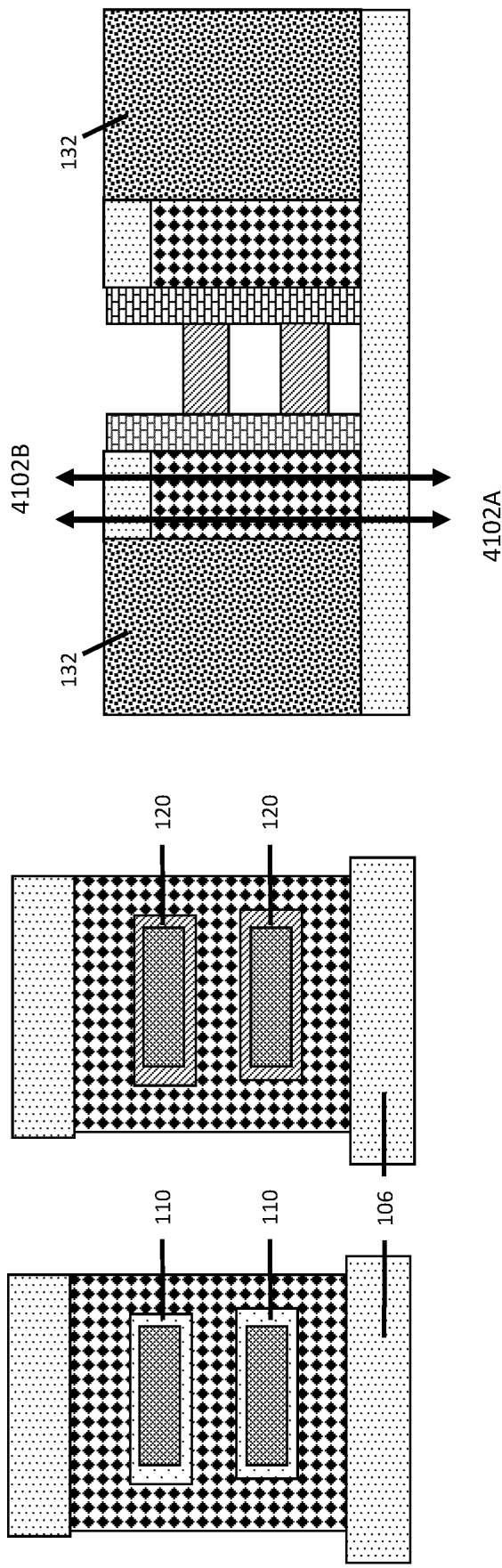

Referring to FIG. 41, illustrated are additional cross-sectional views 4102A and 4102B, and a side view 4100, of the stage in the process flow described in connection with FIG. 40. As shown, after growing the 2D material 120 on the seed material 108, the air gaps between the seed material 108 and the metal contacts 116 and the dielectric materials 114 are filled, such that the 2D material 120 is in contact with the metal contacts 116 and the dielectric materials 114. In addition, a portion of the sacrificial material 110 remains in the device between the seed material 108 and the metal contacts 116, as shown in the cross-sectional view 4102A.

Figure 42:
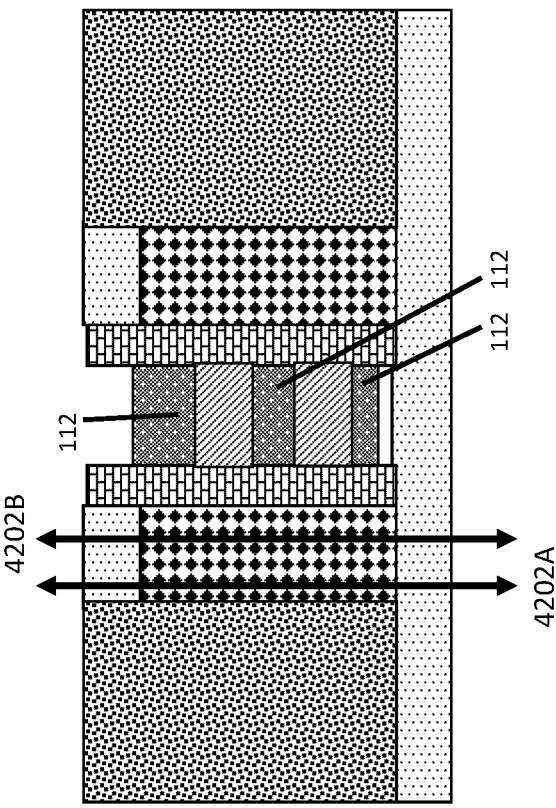
Figure 42:
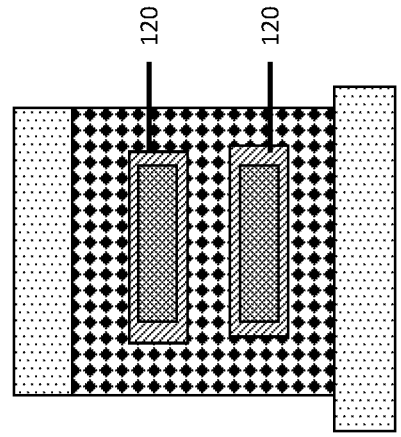
Figure 42:
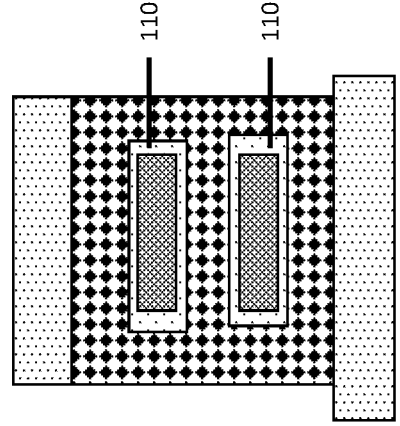

Referring to FIG. 42, illustrated are cross-sectional views 4202A and 4202B, and a side view 4200, of the next stage in the process flow. At this stage, a high-k dielectric 122 (not shown, for simplicity) can be formed on the 2D material 120 in the gap between the second dielectric material 114 structures. The high-k dielectric material 122 acts as a gate dielectric material for the channel, which is defined by the 2D material 120. The high-k dielectric material 122 can be any type of material with a relatively high dielectric constant, and may be deposited at a predetermined thickness to achieve a desired capacitance. In some implementations, the high-k dielectric material 122 can be selectively deposited or grown, such that the high-k dielectric is deposited only on the 2D material 120. The high-k dielectric material 122 may be deposited using any suitable material deposition technique, including but not limited to ALD, CVD, PVD, or PECVD, among others. Once the high-k dielectric material 122 has been formed on the 2D material, a gate metal can be formed on the high-k dielectric 122, shown here as the sacrificial material 112. The gate metal can be any type of metal capable of operating as a gate electrode (e.g., platinum, gold, silver, copper, etc.). In some implementations, and as shown here, the gate metal can be the sacrificial material 112, which may be doped to achieve a desired conductance. The gate metal can be selectively deposited on the high-k dielectric 122, or may completely or substantially fill any gaps between the second dielectric materials 114.

Although not shown here for the sake of simplicity, any of the gate metals, the metal contacts 116, or the cap materials 118 can be electrically connected with one another by patterning appropriate traces, vias, or other connections to form desired circuits. Each of the metal contacts 116 can behave as a source or a drain for one or more transistor structures formed using this process flow. Any type and number of connections may be formed between any types of layers, for example, connections between gate structures to gate structures of other transistor structures, as well as connections between the metal contacts 116 or cap materials 118 to other conductive layers of other transistors. Similarly, it should be understood that the techniques described herein do not require a base layer of silicon, and therefore multiple stacks of material fabricated using the techniques described herein may be formed on top of one another to create large, 3D stacks of transistor structures. Stacks of N-high transistor structures can be manufactured using the techniques described herein. Likewise, any number of parallel Fins of the seed material 108 and the sacrificial material may be formed on the base layer of the dielectric material 106, further increasing possible transistor density.

Figure 43:
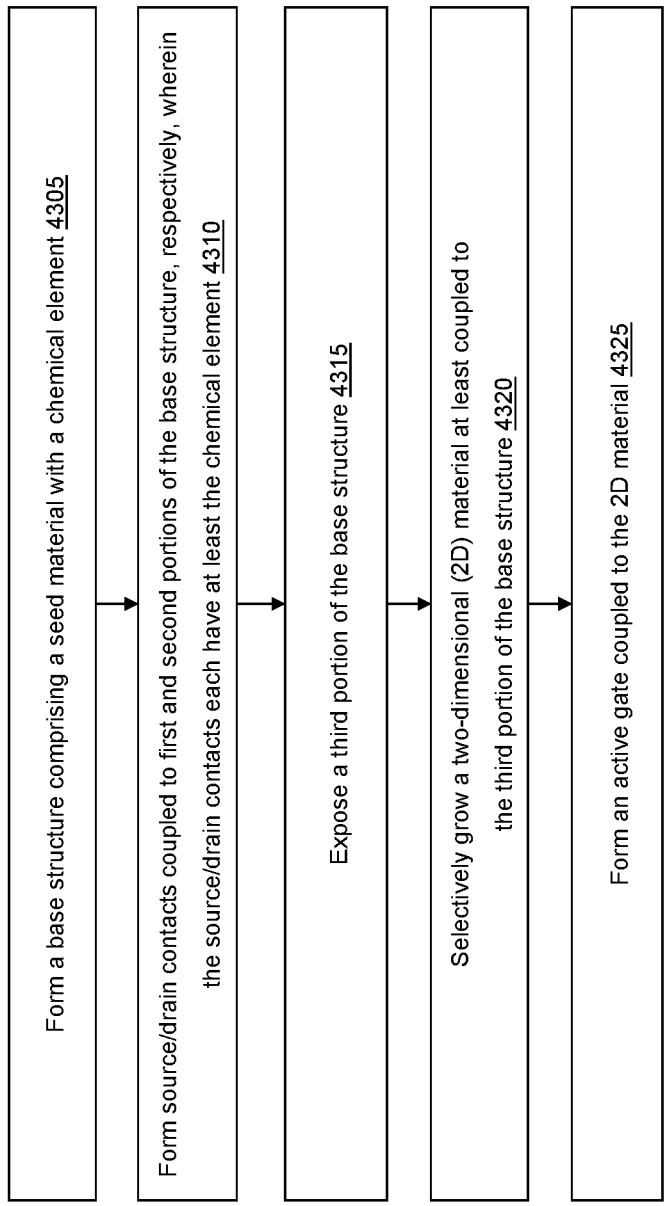
FIG. 43 shows a flow diagram of an example method for fabricating devices using the process flows described in connection with FIGS. 1-42, according to an embodiment.

FIG. 43 show flow diagrams of example methods for fabricating devices using the process flows described in connection with FIGS. 1-42, according to an embodiment. Referring to FIG. 43, illustrated is a flow diagram of a method 4300 for fabricating semiconductor devices. The method 4300 may include steps 4305-4325. However, other embodiments may include additional or alternative steps, or may omit one or more steps altogether.

At step 4305, the method 4300 includes forming a base structure (e.g., the stack of layers depicted in FIG. 1, 11, 19, 25, or 34) comprising a seed material (e.g., the seed material 108) with a chemical element Such processes may be performed using process flow steps similar to those described herein above in connection with FIG. 1, 11, 19, 25, or 34.

At step 4310, the method 4300 includes forming source/drain contacts (e.g., the metal contacts 116) coupled to first and second portions of the base structure, respectively, wherein the source/drain contacts each have at least the chemical element. The metal contact can be partially surrounded by a second dielectric material (e.g., the second dielectric material 144) and aligned with the seed layer. To form the metal contacts, the steps described in connection with FIG. 3-7, 12-15, 20, 30, or 37 can be performed.

At step 4315, the method 4300 includes exposing a third portion of the base structure. To do so, steps similar to those described in connection with FIG. 8, 16, 21, 32, or 38 may be performed.

At step 4320, the method 4300 includes selectively growing a 2D material at least coupled to the third portion of the base structure. To do so, steps similar to those described in connection with FIG. 9, 23, or 40 may be performed.

At step 4325, the method 4300 includes forming an active gate (e.g., a high-k dielectric material and a gate metal) coupled to the 2D material. To do so, the process steps described in connection with FIG. 10, 18, 24, 33, or 42 can be performed.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method, comprising:
   forming a base structure comprising a seed material;
   forming source/drain contacts coupled to first and second portions of the base structure, respectively, wherein the source/drain contacts each have at least a chemical element;
   exposing a third portion of the base structure;
   selectively growing a two-dimensional (2D) material at least coupled to the third portion of the base structure, wherein the 2D material includes the chemical element; and
   forming an active gate coupled to the 2D material.

2. The method of claim 1, wherein the source/drain contacts are formed adjacent to a dummy gate structure, and wherein exposing the third portion of the base structure comprises etching the dummy gate structure.

3. The method of claim 2, wherein forming the source/drain contacts comprises forming a dielectric material isolating the source/drain contacts from the dummy gate structure.

4. The method of claim 1, wherein selectively growing the 2D material comprises selectively growing the 2D material on the source/drain contacts.

5. The method of claim 1, wherein forming the active gate comprises:
   forming a high-k dielectric material on the 2D material; and
   forming a gate metal on the high-k dielectric material, such that the gate metal is isolated from the source/drain contacts.

6. The method of claim 1, wherein the source/drain contacts are formed after the 2D material.

7. The method of claim 1, wherein the 2D material is formed to be coupled to both the first and second portions of the base structure.

8. A device, comprising:
   a base structure comprising a seed material;
   source/drain contacts coupled to first and second portions of the base structure, respectively;
   a two-dimensional (2D) material at least coupled to a third portion of the base structure, wherein the first to third portions of the base structure are not overlapped with one another; and
   an active gate coupled to the 2D material.

9. The device of claim 8, wherein the source/drain contacts are separated from the active gate by a dielectric material.

10. The device of claim 8, wherein the 2D material is coupled to a portion of the source/drain contacts.

11. The device of claim 8, wherein the active gate comprises:
    a high-k dielectric material formed on the 2D material; and
    a gate metal formed on the high-k dielectric material, such that the gate metal is isolated from the source/drain contacts.

12. The device of claim 8, wherein the device is a fin field-effect transistor (FinFET) device, and a fin structure of the FinFET device comprises the seed material and the 2D material.

13. The device of claim 12, wherein the source/drain contacts straddle a portion of the 2D material.

14. The device of claim 8, further comprising a cap layer formed on the source/drain contacts.

15. A transistor structure, comprising:
    a source metal coupled to a first portion of a seed material;
    a drain metal coupled to a second portion of the seed material;
    a channel of a 2D material coupled to the source metal and the drain metal, the 2D material coupled to a third portion of the seed material, wherein the first to third portions of the seed material are not overlapped with one another;
    a high-k dielectric coupled to a portion of the 2D material; and
    a gate metal disposed on the high k-dielectric.

16. The transistor structure of claim 15, wherein the source metal and the drain metal each comprise a chemical element, and the 2D material comprises the chemical element.

17. The transistor structure of claim 15, wherein the channel and the seed material form a fin structure of a FinFET device.

18. The transistor structure of claim 17, wherein the source metal and the drain metal straddle the fin structure.

19. The transistor structure of claim 15, wherein the seed material and the 2D material extend between the source metal and the drain metal, and the seed material is separated from the source metal and the drain metal by the 2D material.

20. The transistor structure of claim 15, wherein the source metal and the drain metal are coupled to the seed material, and the 2D material is formed on the seed material in a region between the source metal and the drain metal.

* * * * *